United States Patent
Chuganey et al.

(10) Patent No.: US 12,283,394 B2
(45) Date of Patent: Apr. 22, 2025

(54) ELECTRICAL CABLE WITH DIELECTRIC FOAM

(71) Applicant: SAMTEC, INC., New Albany, IN (US)

(72) Inventors: Shashi Chuganey, New Albany, IN (US); Yasuo Sasaki, New Albany, IN (US); Scott McMorrow, New Albany, IN (US); Francisco Noyola, New Albany, IN (US); Cindy Lee Diegel, New Albany, IN (US); James Alexander Moss, New Albany, IN (US)

(73) Assignee: SAMTEC, INC., New Albany, IN (US)

( * ) Notice: Subject to any disclaimer, the term of this patent is extended or adjusted under 35 U.S.C. 154(b) by 0 days.

(21) Appl. No.: 18/182,715

(22) Filed: Mar. 13, 2023

(65) Prior Publication Data
US 2023/0215602 A1 Jul. 6, 2023

Related U.S. Application Data

(63) Continuation of application No. 17/059,034, filed as application No. PCT/US2019/033915 on May 24, 2019, now Pat. No. 11,605,480.
(Continued)

(51) Int. Cl.
*H01B 11/18* (2006.01)
*H01B 7/02* (2006.01)
(Continued)

(52) U.S. Cl.
CPC .......... *H01B 11/1821* (2013.01); *H01B 7/02* (2013.01); *H01B 7/0861* (2013.01);
(Continued)

(58) Field of Classification Search
CPC . H01B 11/1821; H01B 11/002; H01B 11/183; H01B 11/203; H01B 11/1839;
(Continued)

(56) References Cited

U.S. PATENT DOCUMENTS

| | | |
|---|---|---|
| 3,643,007 A | 2/1972 | Roberts et al. |
| 3,748,369 A | 7/1973 | Destito et al. |

(Continued)

FOREIGN PATENT DOCUMENTS

| | | |
|---|---|---|
| CA | 2107355 A1 | 10/1992 |
| CN | 102498527 A | 6/2012 |

(Continued)

OTHER PUBLICATIONS

Chen et al., Gas Absorption with Filled Polymer Systems, Technical Papers and Presentations, MuCell Processes, Trexel Inc., https://www.trexel.com/techpp/gasabs.html, internet webpages dated Nov. 3, 2003, 9 pages.

(Continued)

*Primary Examiner* — Hoa C Nguyen
*Assistant Examiner* — Amol H Patel
(74) *Attorney, Agent, or Firm* — BakerHostetler

(57) ABSTRACT

Electrical cables and optical waveguides are disclosed as including an electrically insulative foam. The electrically insulative foam can coat at least one electrical conductor of the electrical cable. The electrically insulative foam can coat the optical fiber of the waveguide. The electrically insulative foam can also define a waveguide.

26 Claims, 8 Drawing Sheets

Related U.S. Application Data

(60) Provisional application No. 62/847,785, filed on May 14, 2019, provisional application No. 62/676,842, filed on May 25, 2018.

(51) Int. Cl.
| | |
|---|---|
| *H01B 7/08* | (2006.01) |
| *H01B 7/18* | (2006.01) |
| *H01B 7/22* | (2006.01) |
| *H01B 11/00* | (2006.01) |
| *H01B 11/20* | (2006.01) |
| *H05K 9/00* | (2006.01) |
| *H01P 3/06* | (2006.01) |

(52) U.S. Cl.
CPC ......... *H01B 7/0892* (2013.01); *H01B 7/1895* (2013.01); *H01B 7/226* (2013.01); *H01B 11/002* (2013.01); *H01B 11/183* (2013.01); *H01B 11/203* (2013.01); *H05K 9/0098* (2013.01); *H01B 7/187* (2013.01); *H01B 7/188* (2013.01); *H01P 3/06* (2013.01)

(58) Field of Classification Search
CPC ...... H01B 7/02; H01B 7/0861; H01B 7/0892; H01B 7/1895; H01B 7/226; H01B 7/187; H01B 7/188; H01B 7/0233; H01B 9/02; H01B 9/025; H01B 9/04; H01B 13/06; H01B 13/26; H01B 3/445; H01P 3/06
See application file for complete search history.

(56) References Cited

U.S. PATENT DOCUMENTS

| | | | |
|---|---|---|---|
| 4,145,567 A | 3/1979 | Bahder et al. | |
| 4,155,613 A | 5/1979 | Brandeau | |
| 4,185,162 A | 1/1980 | Bogese, II | |
| 4,475,006 A | 10/1984 | Olyphant, Jr. | |
| 4,963,695 A | 10/1990 | Marciano-Agostinelli et al. | |
| 5,110,998 A | 5/1992 | Muschiatti | |
| 5,158,986 A | 10/1992 | Cha et al. | |
| 5,160,674 A | 11/1992 | Colton et al. | |
| 5,192,834 A * | 3/1993 | Yamanishi | H01B 7/0233 |
| | | | 174/120 SR |
| 5,227,103 A | 7/1993 | Muschiatti | |
| 5,334,356 A | 8/1994 | Baldwin et al. | |
| 5,684,495 A | 11/1997 | Dyott et al. | |
| 5,866,053 A | 2/1999 | Park et al. | |
| 6,051,174 A | 4/2000 | Park et al. | |
| 6,294,115 B1 | 9/2001 | Blizard et al. | |
| RE37,932 E | 12/2002 | Baldwin et al. | |
| 6,602,064 B1 | 8/2003 | Chen et al. | |
| 6,652,786 B2 | 11/2003 | Sanyal | |
| 6,693,241 B2 | 2/2004 | Carlson et al. | |
| 6,912,777 B2 | 7/2005 | Carlson et al. | |
| 8,575,488 B2 | 11/2013 | Sugiyama et al. | |
| 8,653,373 B2 | 2/2014 | Sugiyama et al. | |
| 8,859,901 B2 | 10/2014 | Gundel | |
| 9,040,824 B2 | 5/2015 | Guetig et al. | |
| 9,064,621 B2 | 6/2015 | Kodama et al. | |
| 9,070,992 B2 | 6/2015 | Hemond et al. | |
| 9,153,361 B2 | 10/2015 | Watanabe et al. | |
| 9,350,571 B2 | 5/2016 | Watanabe et al. | |
| 9,484,127 B2 | 11/2016 | Sugiyama et al. | |
| 9,646,740 B2 | 5/2017 | Gundel | |
| 9,853,342 B2 | 12/2017 | Henry et al. | |
| 9,865,378 B2 | 1/2018 | Gundel | |
| 9,985,332 B2 | 5/2018 | Tsukahara et al. | |
| 9,991,023 B2 | 6/2018 | Buck et al. | |
| 2004/0194996 A1 | 10/2004 | Ysbrand | |
| 2005/0008848 A1 | 1/2005 | Saccomanno et al. | |
| 2006/0131061 A1 | 6/2006 | Seigerschmidt | |
| 2007/0001789 A1 | 1/2007 | Suarez-Gartner et al. | |
| 2007/0108987 A1 | 5/2007 | Satou et al. | |
| 2009/0255706 A1 | 10/2009 | Jiang et al. | |
| 2011/0083877 A1 | 4/2011 | Sugiyama et al. | |
| 2011/0100682 A1 * | 5/2011 | Nonen | H01B 11/203 |
| | | | 174/254 |
| 2012/0186850 A1 | 7/2012 | Sugiyama et al. | |
| 2013/0087361 A1 * | 4/2013 | Kaga | H01B 3/441 |
| | | | 174/110 SR |
| 2013/0146326 A1 | 6/2013 | Gundel et al. | |
| 2013/0180752 A1 | 7/2013 | Kodama et al. | |
| 2013/0277090 A1 | 10/2013 | Nordin et al. | |
| 2014/0076608 A1 | 3/2014 | Fukasaku | |
| 2014/0090869 A1 * | 4/2014 | Kaga | H01B 13/142 |
| | | | 427/119 |
| 2014/0182881 A1 | 7/2014 | Huang et al. | |
| 2014/0299348 A1 | 10/2014 | Daumand | |
| 2015/0003540 A1 * | 1/2015 | Watanabe | H01B 11/002 |
| | | | 375/257 |
| 2015/0047874 A1 | 2/2015 | Thuot et al. | |
| 2015/0162113 A1 * | 6/2015 | Ishikawa | H01B 11/002 |
| | | | 29/828 |
| 2015/0170800 A1 * | 6/2015 | Sugiyama | H01B 13/0016 |
| | | | 29/745 |
| 2015/0294751 A1 | 10/2015 | Shim et al. | |
| 2015/0294761 A1 | 10/2015 | Sugiyama et al. | |
| 2016/0036112 A1 | 2/2016 | Sugiyama et al. | |
| 2016/0246021 A1 | 8/2016 | Otte et al. | |
| 2016/0351298 A1 | 12/2016 | Gundel | |
| 2016/0365175 A1 | 12/2016 | Bennett et al. | |
| 2017/0040088 A1 | 2/2017 | Gundel et al. | |
| 2017/0162300 A1 | 6/2017 | Hasan et al. | |
| 2018/0096755 A1 * | 4/2018 | Tsujino | H01B 7/0241 |
| 2019/0097293 A1 | 3/2019 | Dogiamis et al. | |
| 2019/0198199 A1 * | 6/2019 | Gundel | H01B 11/203 |
| 2019/0318841 A1 | 10/2019 | Hornung et al. | |
| 2020/0083578 A1 | 3/2020 | Yoshimoto et al. | |
| 2021/0383946 A1 | 12/2021 | Chuganey et al. | |

FOREIGN PATENT DOCUMENTS

| | | |
|---|---|---|
| CN | 103208336 A | 7/2013 |
| CN | 105474329 A | 4/2016 |
| CN | 105593730 A | 5/2016 |
| CN | 106297982 A | 1/2017 |
| CN | 107658056 A | 2/2018 |
| CN | 211237751 U | 8/2020 |
| EP | 0580777 A1 | 2/1994 |
| EP | 0985511 A2 | 3/2000 |
| EP | 2057640 A1 | 5/2009 |
| EP | 3324481 A1 | 5/2018 |
| JP | 06-203664 A | 7/1994 |
| JP | 06-506724 A | 7/1994 |
| JP | 2625576 | 7/1997 |
| JP | 3013637 | 2/2000 |
| JP | 2001-035270 A | 2/2001 |
| JP | 2011-113933 A | 6/2011 |
| JP | 2013-247011 A | 12/2013 |
| JP | 2017-147551 A | 8/2017 |
| KR | 10-0171911 B1 | 3/1999 |
| TW | 295300 U | 1/1997 |
| WO | 92/17533 A1 | 10/1992 |
| WO | 2008/020694 A1 | 2/2008 |
| WO | 2013/176710 A1 | 11/2013 |
| WO | 2017/017354 A1 | 2/2017 |
| WO | 2018/063388 A1 | 4/2018 |
| WO | 2018/216636 A1 | 11/2018 |

OTHER PUBLICATIONS

Chen, et al., Effects of Shear Stress and Pressure Drop Rate on Microcellular Foaming Process, Technical Papers and Presentations, MuCell Processes, Trexel Inc., Internet webpages dated Nov. 3, 2003. 7 pages.

Heraeus Epurio—Conductive Polymers and Ultra-Pure Chemicals for New Advances in Electronics, Home page, https://www.heraeus.com/en/hep/home_ec/home_ec_page.html; 2 pages downloaded from the internet on May 23, 2019.

(56) References Cited

OTHER PUBLICATIONS

Heraeus Epurio Clevios (trademark), Clevios (trademark)—PEDOT:PSS, Technical Information; https://www.heraeus.com/en/hep/products_hep/clevios_prod/clevios_1.html, 2 pages, downloaded from internet May 23, 2019.

Hitachi Cable America Inc., High Data Rate Copper Based Direct Attach Cable Assemblies, 25-50-100-200-400 Gbit/s, Product Guide, May 2018, 20 pages.

Kyocera, Silver sintering paste; Semiconductor/Electronic Components Assembly Material; https://global.kyocera.com/prdct/chem/list/scmt/paste/sintering_paste/, 4 pages downloaded from the internet on May 23, 2019.

Liquid Wire, Technology—Liquid Wire, Inc., 2019, 1 page, https://liquidwire.io/technology, internet page dated May 23, 2019.

Pivit et al., Compact 60-GHz lens antenna with self-alignment feature for small cell backhaul, IEEE-APS Topical Conference on Antennas and Propagation in Wireless Communications published Sep. 1, 2017.

Shin, et al., Preparation of Silver Nanoparticles in Ultrasonic Vibration-Induced Nanodroplets of Isopropyl Alcohol in Combination with Ionic Liquids, Bull. Korean Chem. Soc, vol. 32, No. 5, 2011, 1583-1586.

Shin, Preparation of Silver Nanoparticles in Ultrasonic Vibration-Induced Nanodroplets of Isopropyl Alcohol in Combination with Ionic Liquids, Bull. Korean Chem. Soc., 2011, vol. 32, No. 5, 2011, 1583-1586.

Sugiyama et al., Analysis of the Intra-pair Skew Generation Factor in Copper Cable for 25 Gbit/s/ch Transmission, Cable Materials Company, Hitachi Metals, Ltd. vol. 30, 2014, 46-51, with English abstract.

Sugiyama, et al., Analysis of the Intra-pair Skew Generation Factor in Copper Cable for 25 Gbit/s/ch Transmission, Cable Materials Campany, Hitachi Metals, Ltd, vol. 30, 2014, 46-51.

* cited by examiner

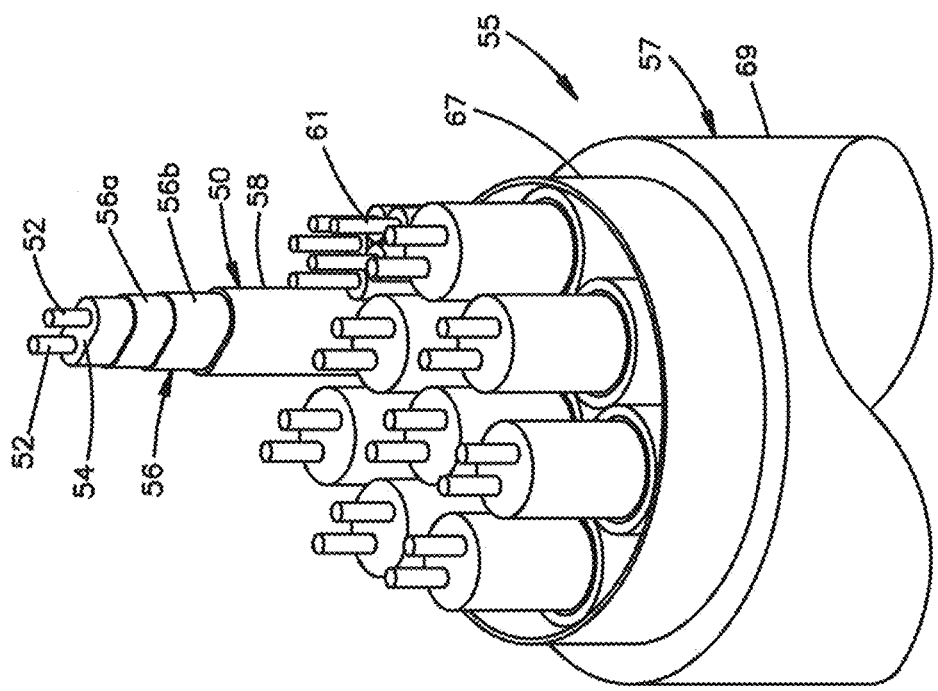
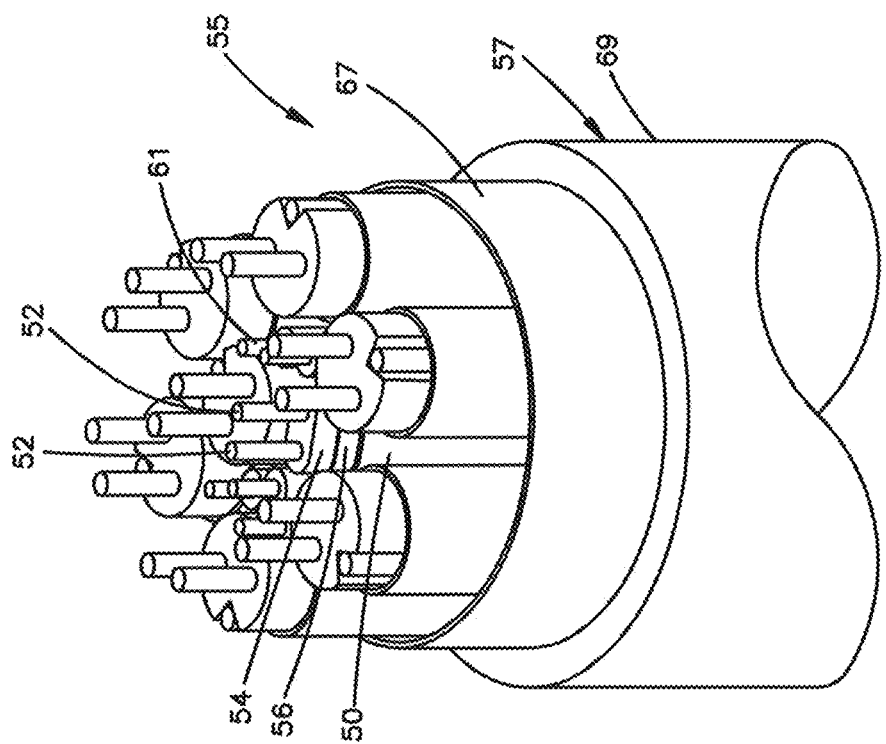

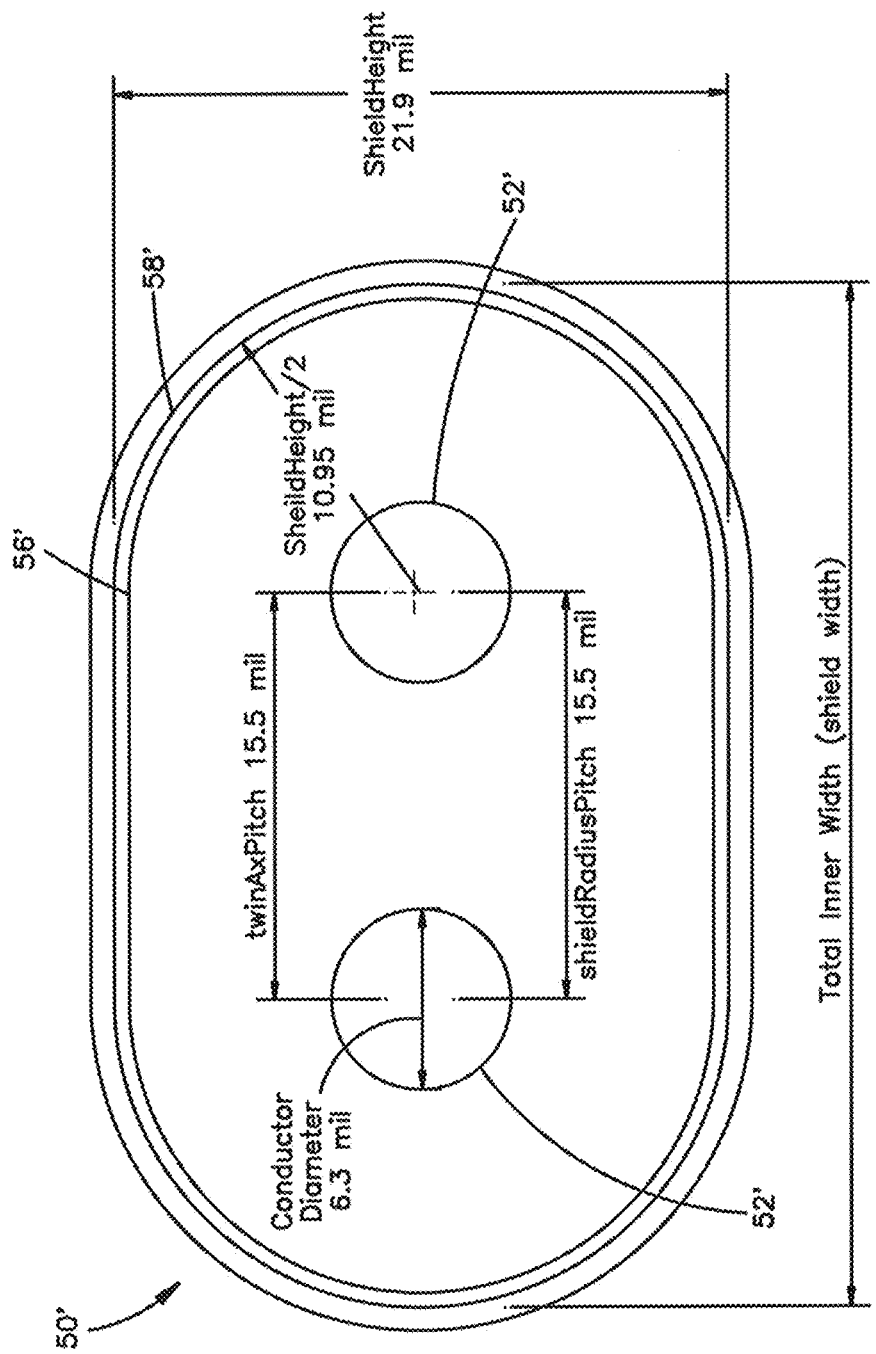

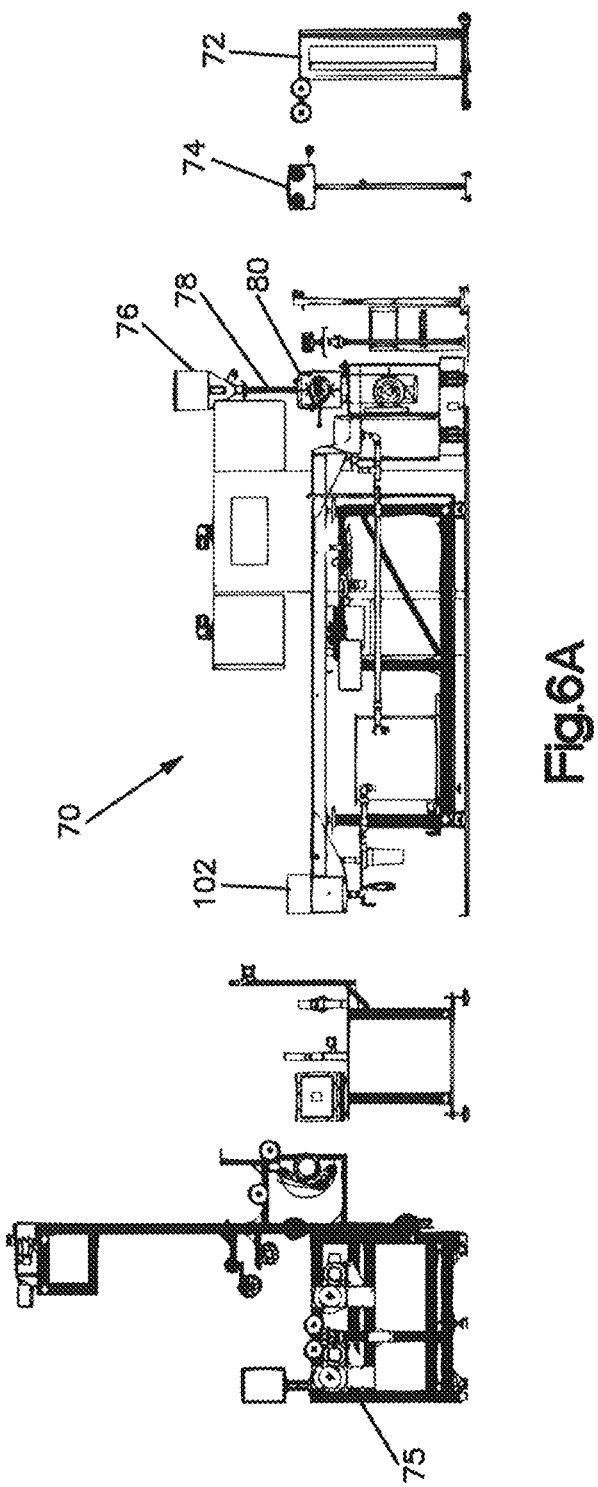

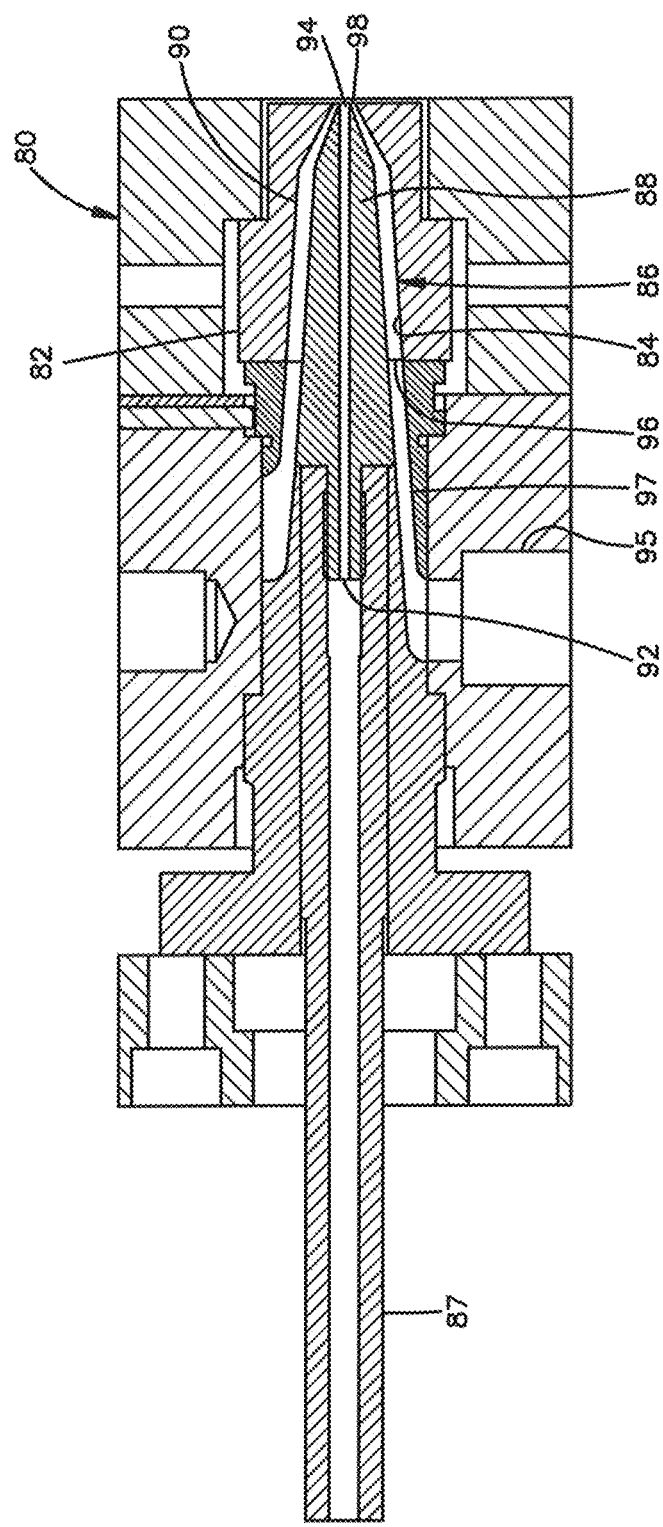

ELECTRICAL CABLE WITH DIELECTRIC FOAM

CROSS-REFERENCE TO RELATED APPLICATIONS

This is a continuation of U.S. patent application Ser. No. 17/059,034 filed Nov. 25, 2020, which is the National Stage Application of International Patent Application No. PCT/US2019/033915, filed May 24, 2019, which claims priority to U.S. patent application Ser. No. 62/676,842 filed May 25, 2018 and U.S. patent application Ser. No. 62/847,785 filed May 14, 2019, the disclosure of each of which is hereby incorporated by reference as if set forth in its entirety herein.

BACKGROUND

Electrical cables are used to electrically connect one electrical component to another electrical component. One example of an electrical cable is a twinaxial electrical cable. Twinaxial electrical cables include a pair of signal conductors that are surrounded by an inner electrical insulator that electrically insulates the signal conductors from each other. Typically an electrical shield surrounds the inner electrical insulator, and is surrounded by an outer electrical insulator. Efforts continue to construct electrical cables so as to improve the signal integrity of electrical signals traveling through the cable.

SUMMARY

In one example, an electrical cable can include a monolithic inner electrical insulator that includes a foam. The electrical cable can further include at least one electrical conductor surrounded by the inner electrical insulator along at least a majority of their respective lengths. The electrical cable can further include an electrically conductive shield that is disposed about at least a majority of a respective overall length of the inner electrical insulator, and an outer electrical insulator that surrounds at least a majority of a respective overall length of the electrically conductive shield.

BRIEF DESCRIPTION OF THE DRAWINGS

The foregoing summary, as well as the following detailed description of illustrative embodiments of the present application, will be better understood when read in conjunction with the appended drawings. For the purposes of illustrating the locking structures of the present application, there is shown in the drawings illustrative embodiments. It should be understood, however, that the application is not limited to the precise arrangements and instrumentalities shown. In the drawings:

FIG. 3A is a perspective view of a bundle of electrical cables in accordance with one example;

FIG. 3B is a perspective view of a bundle of electrical cables in accordance with one example;

FIG. 5 is a schematic cross-sectional view of an electrical cable otherwise identical to the cable illustrated in FIG. 4, but including a solid inner electrical insulator instead of a foamed inner electrical insulator;

FIG. 6A is a schematic side elevation view of a cable fabrication station;

FIG. 6B is a cross-sectional view of a portion of the cable fabrication station including a cross-head;

DETAILED DESCRIPTION

The present disclosure can be understood more readily by reference to the following detailed description taken in connection with the accompanying figures and examples, which form a part of this disclosure. It is to be understood that this disclosure is not limited to the specific devices, methods, applications, conditions or parameters described and/or shown herein, and that the terminology used herein is for the purpose of describing particular embodiments by way of example only and is not intended to be limiting of the scope of the present disclosure. Also, as used herein, the singular forms "a," "an," and "the" include "at least one" and a plurality, unless otherwise indicated. Further, reference to a plurality as used herein includes the singular "a," "an," "one," and "the," and further includes "at least one" unless otherwise indicated. Further still, the term "at least one" can include the singular "a," "an," and "the," and further can include a plurality, unless otherwise indicated. Further yet, reference to a particular numerical value in the specification including the appended claims includes at least that particular value, unless otherwise indicated.

The term "plurality", as used herein, means more than one, such as two or more. When a range of values is expressed, another example includes from the one particular value and/or to the other particular value. The words "substantially" and "approximately" as used herein with respect to a shape, size, or other parameter or numerical value includes the stated shape, size, or other parameter or numerical value, and further includes plus and minus 10% of the stated shape, size, or other parameter or numerical value.

Figure 1A:
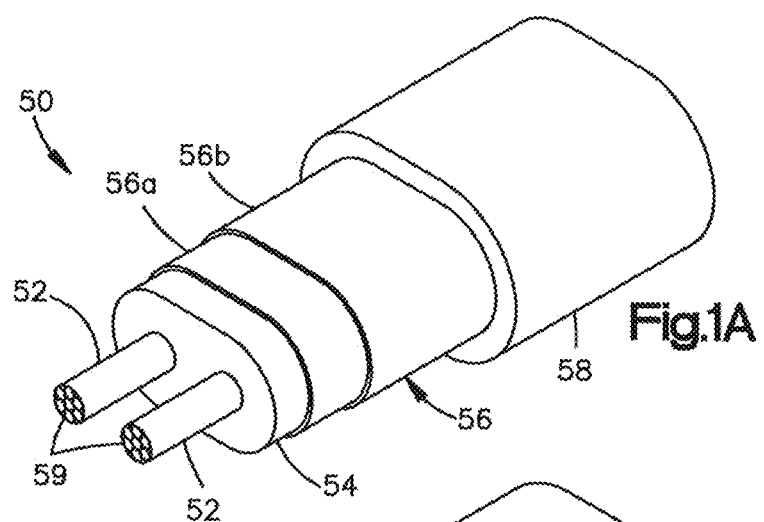
FIG. 1A is a perspective view of a stranded electrical cable constructed in one example, with portions removed for the purposes of illustration.
Figure 1B:
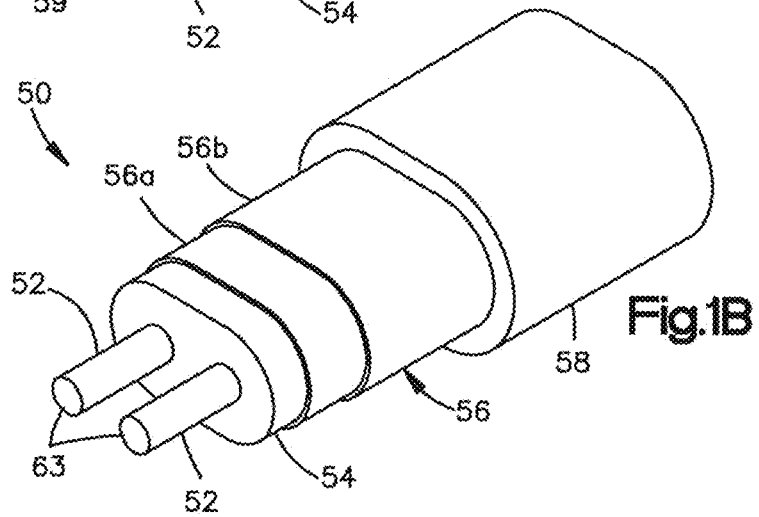
FIG. 1B is a perspective view of an unstranded electrical cable with portions removed for the purposes of illustration.

Referring to FIGS. 1A-1B, an electrical cable 50 in accordance with one embodiment includes at least one electrical conductor 52 and an inner electrical insulator 54 that is elongate along a central axis, and surrounds the at least one electrical conductor 52. As is described in more detail below, the electrical insulator 54 can be a foam. The electrical cable 50 can include an electrically conductive shield 56 that surrounds the inner electrical insulator 54, and an outer electrical insulator 58 that surrounds the electrical shield 56. The electrical shield 56 can provide electrical shielding, and in particular EMI (electromagnetic interference) shielding to the electrical conductor 52 during operation.

In one example, the electrical cable 50 can be configured as a twinaxial cable. Thus, the at least one electrical conductor 52 can include a pair of electrical conductors 52. The electrical conductors can be oriented substantially parallel to each other and spaced apart from each other. Further, the pair of electrical conductors 52 can define a differential signal pair. Accordingly, while the electrical cable 50 is described herein as a twinaxial cable, it should be appreciated that the electrical cable 50 can alternatively be configured as a coaxial cable whereby the at least one electrical conductor 52 is a single electrical conductor. However, it should further be recognized that the electrical cable 50 can include any number of electrical conductors as desired. When the electrical cable 50 includes a plurality of electrical conductors 52, the inner electrical insulator 54 can electrically insulate the electrical cables 50 from each other.

It is recognized that the electrical conductors 52 extend along respective lengths that can be measured along respective central axes of the electrical conductors 52. Similarly, the electrical insulator 54 extends along a respective length that can be measured along a central axis of the electrical cable 50. Further, the electrical shield 56 extends along a respective length that can be measured along the central axis of the electrical cable 50. Further still, the outer electrical insulator 58 extends along a respective length that can be measured along the central axis of the electrical cable 50. It is recognized that as fabricated, the respective lengths of the electrical conductors 52, the electrical insulator 54, the electrical shield 56, and the outer electrical insulator 58 can be substantially equal to each other. Further, the electrical shield 56 can surround the inner electrical insulator 46 along at least a majority of its respective length.

However, during use, it is recognized that the electrical conductors 52 can be mounted to electrical contacts of a complementary electrical device. Thus, the electrical conductors 52 can extend out with respect to one or more up to all of the inner electrical insulator 54, the electrical shield 56, and the outer electrical insulator 58. Accordingly, it can be said that the inner electrical insulator 54 surrounds the electrical conductors 52 along at least a majority of their respective lengths. Further, during use, it is recognized that the electrical shield can be mounted to at least one electrical contact of a complementary electrical device. Alternatively, the electrical cable 50 can include an electrically conductive drain wire that is mounted to an electrical contact of a complementary electrical device. Thus, the electrical shield 56 can extend out with respect to one or more up to all of the electrical conductors 52, the inner electrical insulator 54, and the outer electrical insulator 58. Accordingly, it can be said that the outer electrical insulator 58 surrounds the electrical shield 56 along at least a majority of its respective length. The term "at least a majority" can refer to 51% or more, including a substantial entirety.

With continuing reference to FIGS. 1A-1B, the electrically conductive shield 56 can include a first layer 56a that can surround and abut the inner electrical insulator 54, and a second layer 56b that can surround the first layer 56a. Alternatively, the electrically conductive shield can be configured as only a single layer that surrounds and abuts the inner electrical insulator 54 along at least a majority of its length. One or both of the first and second layers 56a and 56b can be made of any suitable electrically conductive material. For instance, the electrically conductive material can be a metal. Alternatively, the electrically conductive material can be an electrically conductive diamond-like carbon (DLC). The first layer 56a can be configured as an electrically conductive foil. For instance, the electrically conductive foil can be configured as a copper film that surrounds and abuts the inner electrical insulator 54. The copper film can have any suitable thickness as desired. In one example, the thickness can be in a range from approximately 0.0003 inch to approximately 0.001 inch. For instance, the range can be from approximately 0.0005 inch to approximately 0.0007 inch. In one specific example, the thickness can be approximately 0.0005 in. It has been found that the copper film can withstand large tensile forces, as can occur when the electrical cable 50 is bent. As described above, the inner electrical insulator 54 can be made from dielectric foam, which has a lower resistance to bending than its solid dielectric counterpart at the same thickness.

The second layer 56b can be configured as a film that surrounds and abuts the first layer 56a. The second layer 56b can be configured as a mylar film in one example. Alternatively, the electrical shield 56 can be configured as a braid. The electrical shield 56 can alternatively be configured as a flat wire, round wire, or any suitable shield as desired. In some examples, the electrical shield 56 can be configured as an electrically conductive or nonconductive lossy material.

In this regard, it will be appreciated that the electrical shield 56 can be suitable constructed in any manner as desired, including at least one electrically conductive layer. The at least one electrically conductive layer can be configured as a single electrically conductive layer, first and second electrically conductive layers, or more than two electrically conductive layers. In one example, the first electrically conductive layer 56a can be wrapped about the inner electrical insulator 54. For instance, the first electrically conductive layer 56a can be helically wrapped about the inner electrical insulator 54. Alternatively, the first electrically conductive layer 56a can be longitudinally wrapped about the inner electrical insulator 54 so as to define a longitudinal seam that extends along the direction of elongation of the inner electrical insulator 54. Further, the second electrically conductive layer 56b can be wrapped about the first electrically conductive layer 56a. For instance, the second electrically conductive layer 56b can be helically wrapped about the first electrically conductive layer 56a. Alternatively, the second electrically conductive layer 56b can be longitudinally wrapped about the first electrically conductive layer 56a so as to define a longitudinal seam that extends along the direction of elongation of the inner electrical insulator 54.

When the electrical shield 56 is configured as a single electrically conductive material, the single layer can be wrapped about the inner electrical insulator 54. For instance, the single layer can be helically wrapped about the inner electrical insulator 54. Alternatively, the single layer can be longitudinally wrapped about the inner electrical insulator 54 so as to define a longitudinal seam that extends along the direction of elongation of the inner electrical insulator 54. In another example, the electrical shield 56 can include or be defined by an electrically conductive coating that is applied to the radially outer surface of the inner electrical insulator 54 along at least a majority of the length of the inner electrical insulator. The coating can be metallic. For instance, the coating can be a silver coating. Alternatively the coating can be a copper coating. Alternatively still, the coating can be a gold coating. The outer electrical insulator 58 can surround and abut the second layer 56b.

Figure 3C:
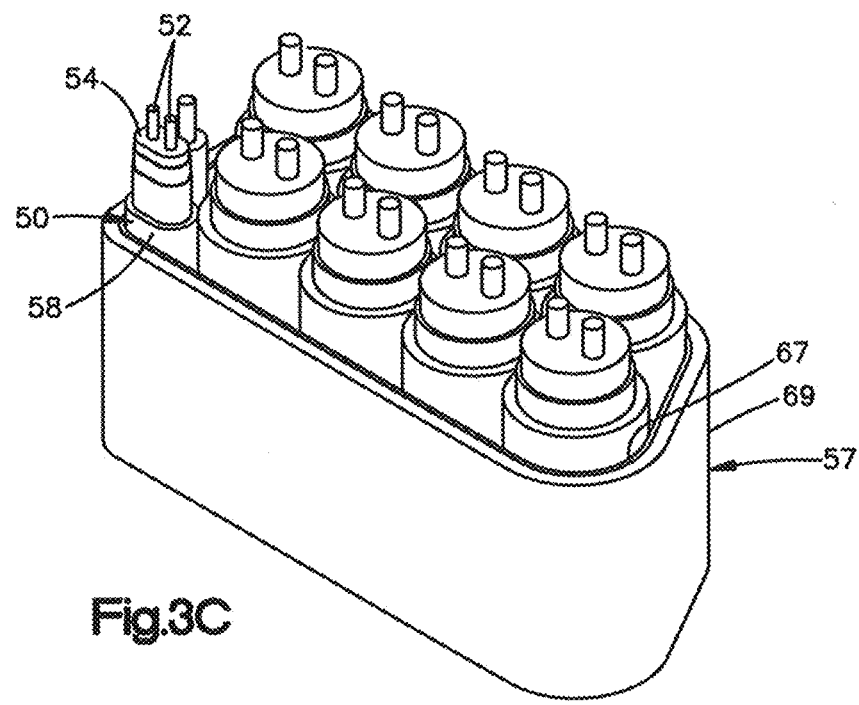
FIG. 3C is a perspective view of a bundle of electrical cables in accordance with one example.

Referring to FIGS. 3A-3C, a bundle 55 can be provided that includes a plurality of the electrical cables 50. For instance, as illustrated in FIGS. 3A and 3B, the electrical cables 50 can be arranged so as to define a round outer perimeter of the bundle 55. The bundle 55 can include an outer sleeve 57 and a plurality of the electrical cables 50 disposed in the outer sleeve 57. The outer sleeve 57 can include an electrical conductor 67 surrounded by an electrical insulator 69. The electrical conductor 67 can provide electrical shielding. It should be appreciated that the electrical conductor 67 can be configured as a metal or electrically conductive lossy material. Alternatively, the electrical conductor 67 can be replaced by an electrically nonconductive lossy material. In one example, the outer perimeter of the outer sleeve 57 can be substantially circular. Thus, a plurality of electrical cables 50 can be circumferentially arranged in the outer sleeve 57. Respective centers of the electrical conductors 52 of each of the electrical cables 50 can be spaced apart from each other along a direction. The bundle 55 can further include at least one coaxial cable 61 as desired. The coaxial cable 61 can include a single electrical conductor surrounded by an electrical insulator. The electrical insulator of the coaxial cable 61 can be configured as described herein with respect to the inner electrical insulator 54.

As illustrated in FIG. 3A, the direction of the respective electrical cables 50 can differ from circumferentially adjacent others of the electrical cables 50. In one example, the direction of at least one or more up to all of the circumferentially arranged cables 50 can be substantially tangent to the outer sleeve 57. For instance, the direction can be tangent to the outer sleeve at a location that intersects a line perpendicular to the direction and equidistantly spaced from the respective centers of the electrical conductors 52. As illustrated in FIG. 3B, the electrical cables 50 can be arranged in respective linear arrays of at least one electrical cable 50, such that the electrical conductors 52 of each of the electrical cables 50 along a linear array are aligned with each other. Otherwise stated, the direction that separates the electrical conductors 52 from each other can be the same direction along each linear array. Further, the direction of each of the linear arrays can be parallel to the direction of one or more up to all others of the linear arrays.

Referring to FIG. 3C, the bundle 55 can be elongate in cross-section. For instance, the outer sleeve 57 can surround two rows of electrical cables 50. Each row of electrical cable 50 can define a linear array along a direction that separates the respective centers of the electrical conductors 52 of each of the electrical cables 50 along the linear array from each other.

As illustrated in FIG. 1A, each of the electrical conductors 52 can be defined by a plurality of strands 59 that are disposed adjacent each other and in mechanical and electrical contact with each other. Otherwise stated, the electrical conductors 52 can be stranded. The strands 59 of each conductor 52 can be oriented substantially parallel to each other in one example. Alternatively, the strands 59 can be woven with each other, braided, or alternatively arranged as desired. Each electrical conductor 52 can include any suitable number of strands 59 as desired. For instance, the number of strands 59 can range from approximately 5 strands 59 to approximately 50 strands 59 as one example. In one example, the number of strands 59 can range from approximately 15 strands to approximately 30 strands. In certain specific examples, the number of strands 59 of each electrical conductor 52 can be approximately 7, approximately 19, or approximately 29. The strands can be cylindrical or alternatively shaped as desired. In some examples, the strands 59 can be fed into a sizing die so as to radially compress the strands against each other as desired. Alternatively, referring to FIG. 1B, the electrical conductors 52 can define a single unitary monolithic solid structure 63. Otherwise stated, the electrical conductor can be unstranded. The electrical conductor 52 can be cylindrical as desired.

The electrical conductors 52 can have any suitable size as desired. For instance, the electrical conductors 52 can have a size or gauge that ranges from approximately 25 American wire gauge (awg) to approximately 36 awg both when the electrical conductors 52 are stranded, and when the electrical conductors 52 are unstranded. Gauge size awg can be measured in accordance with any appropriate applicable standard, such as ASTM B258. Thus, it should be appreciated that the electrical conductors 52 can have a size that ranges from approximately 27 awg to approximately 29 awg or from approximately 31 awg to approximately 36 awg. When the electrical conductors 52 are unstranted, the electrical conductors 52 can have a gauge that ranges from approximately 26 awg to approximately 36 awg. When the electrical conductors 52 are stranded, the electrical conductors can have a gauge that is approximately 25 awg, ranges from approximately 27 aww to approximately 39 awg, or ranges from approximately 31 awg to approximately 36 awg. It should be appreciated that the sizes of the electrical conductors 52 are presented by way of example only, and the size of the conductors 52 should not be construed as limiting unless specifically so stated.

The electrical conductors 52, both stranded or unstranded, can be provided as any one or more suitable electrically conductive material. The electrically conductive material can be a metal. For instance, the electrically conductive material can be at least one of copper, copper-nickel (CuNi), silver, tin, aluminum, any suitable alloy thereof, and any suitable alternative materials. Further, in one example, the electrical conductors 52 can include an electrically conductive plating. For example, the electrically conductive plating can be a metal. In one example, the electrically conductive plating can be at least one of copper, silver, aluminum, tin, any suitable alloy thereof, and any suitable alternative materials. In one specific example, the electrical conductors can be defined by a silver-plated coper alloy.

The outer electrical insulator 58 can be any suitable electrically insulative material. For instance, the outer electrical insulator 58 can be at least one of polyvinyl chloride (PVC), a polymer made of monomer tetrafluoroethylene, monomer hexafluoropropylene, and monomer vinylidene fluoride (THV), fluorinated ethylene propylene (FEP), perfluoroalkoxy (PFA), thermoplastic polyurethane (TPU), a sealable polymer tape, and a non-sealable polymer tape. Alternatively, the material can be any suitable polymer such as polyethylene or polypropylene. It should be appreciated that any alternative polymer capable of being foamed is also envisioned.

Figure 2:
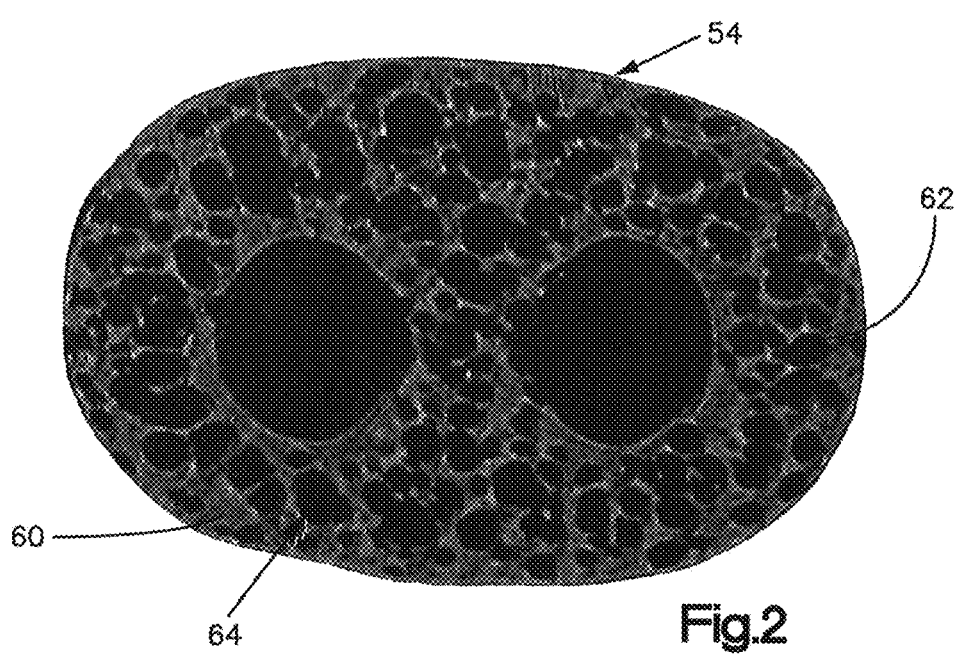
FIG. 2 is a SEM micrograph of a cross-section of an inner electrical insulator of the electrical cable illustrated in FIGS. 1A and 1B.

Referring now to FIG. 2, and as described above, the inner electrical insulator 54 can be a dielectric foam 62. As will be appreciated from the description below, the dielectric foam 62 can be extruded. For instance, the dielectric foam 62 can be coextruded with the electrical conductors. The inner electrical insulator 54 can include the dielectric foam 62 and a plurality of gaseous voids at least partially defined by the dielectric foam 62. The gaseous voids can thus be contained inside the electrical shield 56. For instance, a plurality of the gaseous voids can be defined by a matrix of pores 64 in the dielectric foam 62. In one example, all of the gaseous voids can be defined by the matrix of pores 64. Alternatively, one or more of the gaseous voids can be defined by air pockets that are defined between the dielectric foam 62 and the electrical shield 26 as desired. Thus, the dielectric foam can include only a single electrically insulative material 60 that defines the matrix of pores 64 so as to define the dielectric foam 62. The pores 64 can include a first gas. For instance, the pores 64 can include only the first gas in some examples. The gaseous voids defined between the dielectric foam 62 and the electrical shield 56, if present, can include a second gas different than the first gas. For instance, an entirety of the gaseous voids defined between the dielectric foam 62 and the electrical shield 56 can include only the second gas. It should therefore be appreciated that the electrical cable 50 can include only a single electrically insulative material 60 inside the electrical shield 60 and the gaseous voids.

In some examples, the inner electrical insulator 54 can be a coextruded unitary monolithic structure that surrounds each of the electrical conductors 52, as opposed to first and second discrete electrical insulators that surround respective ones of the electrical conductors 52. The electrically insulative material 60 can be any suitable insulator. In one example, the electrically insulative material 60, and thus the foam, can be a fluoropolymer. The fluoropolymer can, for instance, be a fluorinated ethylene propylene (FEP) or a perfluoroalkoxy alkane. In one example, the fluoropolymer can be Teflon™. It is recognized that the dielectric foam 62 can be fabricated by introducing a foaming agent into the electrically insulative material 60. In one example, the foaming agent can be nitrogen. Alternatively, the foaming agent can be argon. It should be appreciated, of course, that any suitable alternative foaming agent can be used.

Figure 4:
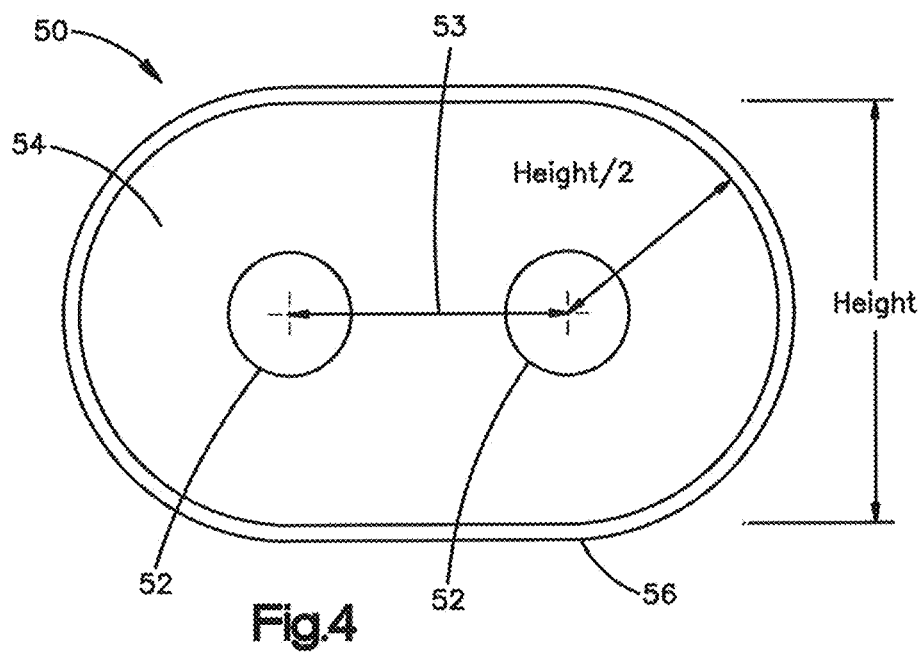
FIG. 4 is a schematic cross-sectional view of the cables illustrated in FIGS. 1A and 1B, with portions removed for illustrative purposes.
Figure 6C:
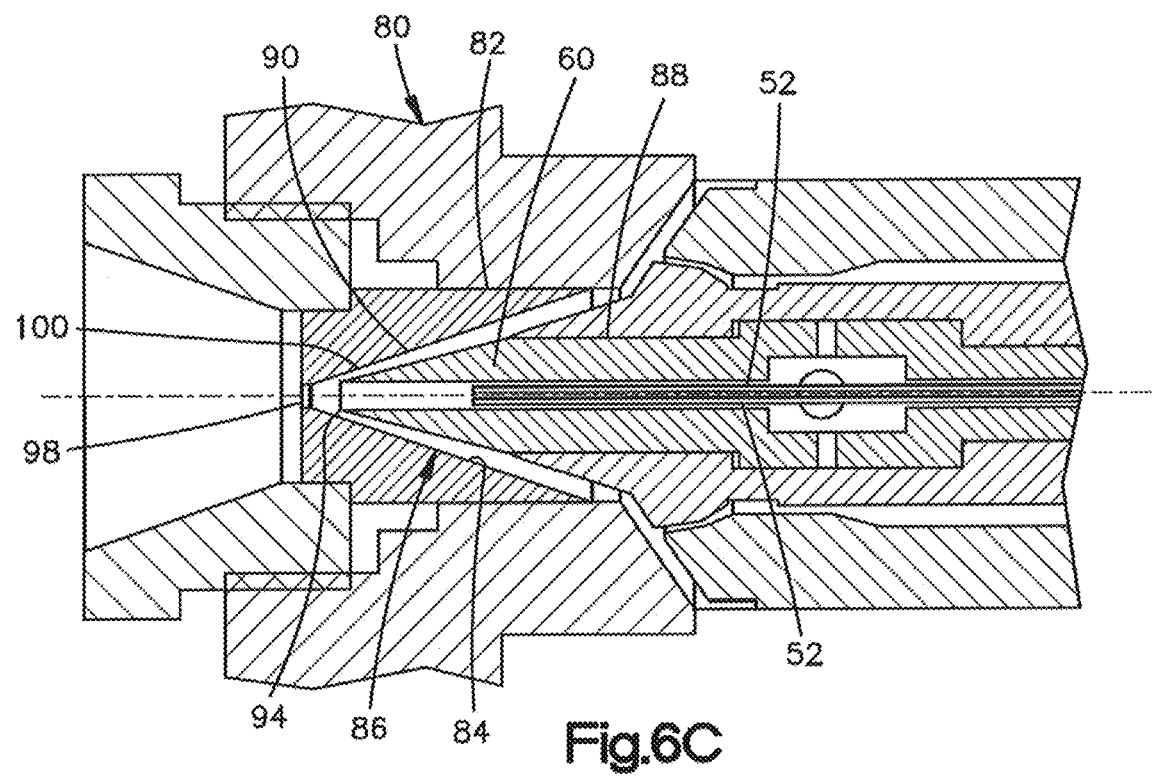
FIG. 6C is an enlarged cross-sectional view of a portion of the cross-head illustrated in FIG. 6B, with electrical conductors and molten electrically insulative material disposed therein, showing the molten electrically conductive material encapsulating the electrical conductors.
Figure 6D:
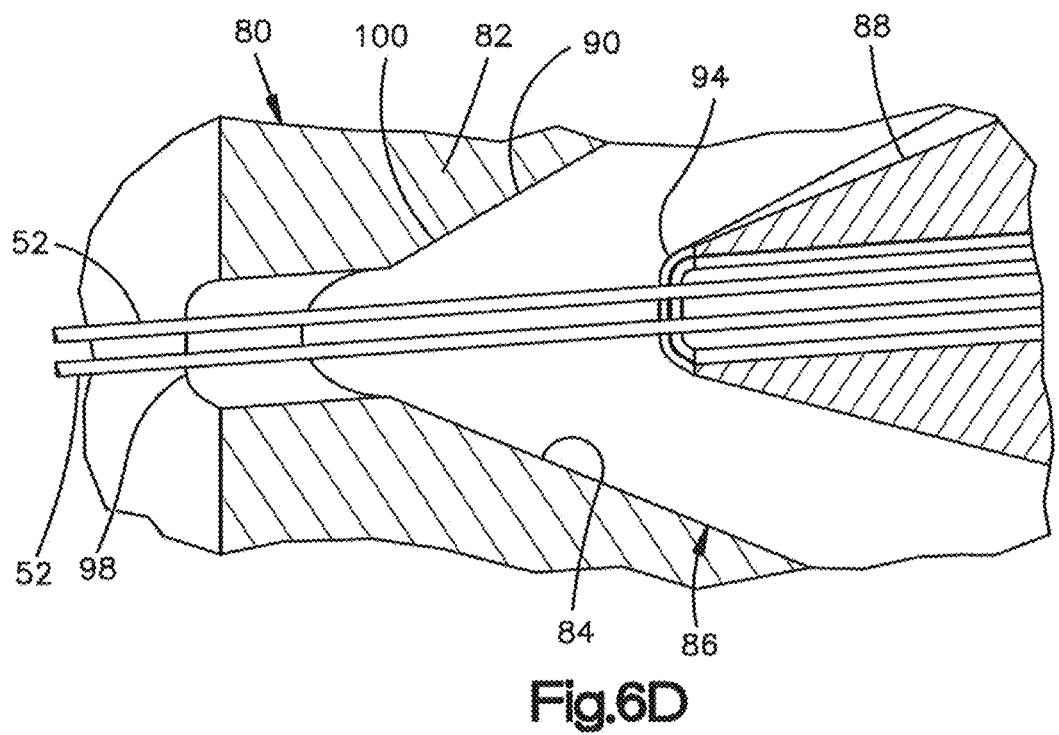
FIG. 6D is an enlarged portion of the cross-head illustrated in FIG. 6C, showing electrical conductors extending therethrough.

Referring now to FIG. 4, the electrical cable 50 is shown with the outer electrical insulator removed, to show various dimensions of the electrical cable, whereby the height and the width are of the electrical shield 56. the inner electrical insulator 54 can be substantially oval or substantially racetrack shaped in a plane that is oriented perpendicular to one or both of the central axes, and thus lengths, of the electrical conductors 52 and the central axis, and thus length, of the electrical cable 50. As a result, the electrical shield 56 can be in mechanical contact with a substantial entirety of the outer perimeter of the inner electrical insulator 54. The respective centers of the electrical conductors 52 are spaced from each other any suitable separation distance 53, or pitch, as desired along a direction.

The separation distance 53 can range from approximately 0.01 inch to approximately 0.035 inch. In one example, the separation distance 53 can range from approximately 0.01 inch to approximately 0.02 inch. When the electrical cable 50 is approximately 34 gauge awg, the separation distance 53 can be approximately 0.012 inch. The electrical shield 56 can have a height that ranges from approximately 0.017 inch to approximately 0.06 inch. For instance, the height of the electrical shield 56 can be approximately 0.021 when the electrical cable 50 is approximately 34 gauge awg. The height can be measured in cross-section perpendicular to the separation distance 53 that separates the electrical conductors 52. For instance, the height can be measured in a plane that is oriented perpendicular to the central axis of the electrical cable 50, and thus is also oriented perpendicular to the central axes of the electrical conductors 52. The electrical shield 56 can have a width that ranges from approximately 0.026 inch to approximately 0.095. For instance, the width of the electrical shield 56 can be approximately 0.0338 when the electrical cable 50 is approximately 34 gauge awg. When the electrical cable is approximately 33 gauge, the width of the electrical shield 56 can be approximately 37.4. The width can be measured in cross-section coextensive with the separation distance 53. For instance, the width can be measured in a plane that is oriented perpendicular to the central axis of the electrical cable 50, and thus is also oriented perpendicular to the central axes of the electrical conductors 52. Each of electrical conductors 52 can have a maximum cross-sectional dimension that ranges from approximately 0.005 inch to approximately 0.018. inch. For instance, the maximum cross-sectional dimension can be approximately 0.006 inch when the electrical cable 50 is approximately 34 gauge awg. Respective ends of the electrical shield 56 in cross-section can be defined by a swept radius from the respective centers of the electrical signal conductors 52. The radius can equal one-half the height of the electrical shield 56. The cross-section is in a plane that is perpendicular to the central axes of the electrical conductors 52.

Referring now to FIGS. 4-5, the electrical cable 50 of a given gauge size can be smaller than an otherwise identical electrical cable 50' of the same gauge size but whose inner electrical insulator 54' is of the same electrically insulative material, but solid as opposed to foamed. The otherwise identical electrical cable 50' thus includes a pair of electrical conductors 52', an insulator 54', a shield 56', and an outer electrical insulator 58'. All parts of the otherwise identical electrical cable 50' are the same as the electrical cable 50 with the exception of the inner electrical insulator 54'. Further, as will be described in more detail below, certain dimensions and/or the electrical performance of the otherwise identical electrical cable 50' can vary from that of the electrical cable 50 due to the difference between the foamed inner electrical insulator 54 of the electrical cable 50 and the foamed inner electrical insulator 54' of the otherwise identical electrical cable 50'.

The foamed inner electrical insulator 54 of the electrical cable 50 can have a reduced thickness than that of the solid electrical insulator 54' of the otherwise identical electrical cable 50' at respective same locations of the foamed electrical insulator 54 and the solid electrical insulator 54'. Accordingly, the electrical cable 50 can have a reduced cross-sectional size with respect to the otherwise identical electrical cable 50'. For instance, one or both of the height and width of the electrical cable 50 can be less than one or both of the height and width, respectively, of the otherwise identical electrical cable 50' when the electrical conductors 52 are the same gauge as the electrical conductors 52' of the otherwise identical electrical cable 50'. Accordingly as described in more detail below, the electrical cable 50 can similarly sized with respect to the otherwise identical electrical cable 50', but can exhibit improved electrical performance, such as reduced insertion loss, with respect to the otherwise identical electrical cable 50'. Further, the electrical cable 50 can sized smaller than the otherwise identical electrical cable 50', but can exhibit the same or better electrical performance, such as reduced insertion loss, with respect to the otherwise identical electrical cable 50'. For instance, as will be described in more detail below, the electrical cable 50 whose conductors 52 are approximately 35 gauge awg can exhibit less insertion loss than the otherwise identical electrical cable whose conductors are approximately 34 gauge awg. Further still, the electrical cable 50 can be constructed with electrical conductors 52 having a reduced gauge (i.e., greater size in cross-section) than the electrical conductors 52' of the otherwise identical electrical connector 50', while the width of the electrical shield 56 is approximately equal to the width of the electrical shield 56' of the otherwise identical electrical cable 50. Thus, when a plurality of the electrical cables 50 form a ribbon along the width direction, increased performance can be achieved without widening an otherwise identical ribbon that includes the otherwise identical electrical cable 50'.

Referring to FIGS. 1A-2, the pores 64 of the dielectric foam 62 can be disposed circumferentially about each of the electrical conductors 52. The pores 64 provide electrical insulation while at the same time presenting a lower the dielectric constant Dk than the electrically insulative material 60. In this regard, it can be desirable to fabricate the electrical cable 50 so as to limit the number of open pores 64, meaning those pores that are not fully enclosed by the electrically insulative material 60. Thus, the electrical cable 50 can be fabricated such that a majority of the pores 64 can be fully enclosed by the electrically insulative material 60. In one example, at least approximately 80% of the pores 64 can be fully enclosed by the electrically insulative material 60. For instance, at least approximately 90% of the pores 64 can be fully enclosed by the electrically insulative material 60. In particular, at least approximately 95% of the pores 64 can be fully enclosed by the electrically insulative material 60. For example, substantially all of the pores 64 can be fully enclosed by the electrically insulative material 60.

Further, the electrical cable 50 can be fabricated such that one or both of the radially inner perimeter and the radially outer perimeter of the inner electrical insulator 54 are defined by respective radially inner and outer surfaces that are substantially continuous and uninterrupted by open pores 64. In this regard, the inner electrical insulator 54 can be geometrically divided into a radially inner half and a radially outer half. The radially inner half defines the radially inner perimeter and surface. The radially outer half defines the radially outer perimeter and surface.

In one example, at least approximately 80% of the pores disposed in the radially outer half of the inner electrical insulator 34 are fully enclosed by the electrically insulative material. For instance, at least approximately 90% of the pores 64 disposed in the radially outer half of the inner electrical insulator 34 can be fully enclosed by the electrically insulative material 60. In particular, at least approximately 95% of the pores 64 disposed in the radially outer half of the inner electrical insulator 34 can be fully enclosed by the electrically insulative material 60. For example, substantially all of the pores 64 disposed in the radially outer half of the inner electrical insulator 34 can be fully enclosed by the electrically insulative material 60.

Similarly, in one example, at least approximately 80% of the pores disposed in the radially inner half of the inner electrical insulator 34 are fully enclosed by the electrically insulative material. For instance, at least approximately 90% of the pores 64 disposed in the radially inner half of the inner electrical insulator 34 can be fully enclosed by the electrically insulative material 60. In particular, at least approximately 95% of the pores 64 disposed in the radially inner half of the inner electrical insulator 34 can be fully enclosed by the electrically insulative material 60. For example, substantially all of the pores 64 disposed in the radially inner half of the inner electrical insulator 34 can be fully enclosed by the electrically insulative material 60.

The pores 64 can be distributed substantially uniformly about each of the electrical conductors 52. For instance, substantially all straight lines along a cross-sectional plane that extend radially outward from the center of either of the electrical conductors 52 intersects at least one pore 64. For instance, substantially all straight lines along a cross-sectional plane that extend radially outward from the center of either of the electrical conductors 52 can intersect at least two pores 64. The pores 64 can have any suitable average void volume as desired that provides for the substantial uniformity and also imparts the desired dielectric constant to the inner electrical insulator 54. In one example, the average void volume of the pores 64 can be less than the wall thickness of the inner electrical insulator. The inner wall thickness can be defined as the thickness from each of the electrical conductors 52 to either the outer perimeter of the inner electrical insulator 54, or the thickness of the inner electrical insulator that extends between the electrical conductors 52. In one example, the average void volume of the pores 64 can be less than approximately 50% of the wall thickness. For instance, the average void volume of the pores 64 can be less than or equal to approximately one-third of the wall thickness. The pores 64 can define a void volume that ranges from approximately 10% to approximately 80% of the total volume of the inner electrical insulator 34. For instance, the void volume can range from approximately 40% to approximately 70% of the total volume of the inner electrical insulator 34. In particular, the void volume can be approximately 50% of the total volume of the inner electrical insulator 34.

Thus, the pores 64 can reduce the dielectric constant of the dielectric foam 62 to a lower dielectric constant Dk than that of the electrically insulative material 60 in solid form (i.e., without the pores 64). Otherwise stated the dielectric foam 62 can have a lower dielectric constant Dk than the insulative material 60. The dielectric constant Dk of the dielectric foam 62 can be reduced by increasing the volume of pores 64 in the electrically insulative material. Conversely, the dielectric constant Dk of the dielectric foam 62 can be increased by decreasing the total volume of pores 64 in the electrically insulative material.

It has been found that reducing the dielectric constant Dk of the dielectric foam 62 can allow electrical signals to travel along the electrical conductors 52 at higher data transfer speeds. However, it has been further found that as the dielectric constant Dk decreases, the mechanical strength of the electrical insulator 54 can decrease due to the higher percentage of air or other gas relative to electrically insulative material 60. Further, as the dielectric constant Dk decreases, the electrical stability of the electrical signals traveling along the electrical conductors 52 can decrease. In one example, the electrically insulative material and total volume of pores 64 can be chosen such that the dielectric constant Dk of the dielectric foam 62 can range from 1.2 up to, but not including, the dielectric constant Dk of the electrically insulative material 60. When the electrically insulative material is Teflon™, for instance, the dielectric constant Dk of the dielectric foam 62 can range from approximately 1.2 Dk to approximately 2.0 Dk. In one example, the dielectric constant can range from approximately 1.3 Dk to approximately 1.6 Dk, it being appreciated that increasing the pore volume in the foam 62 can reduce the dielectric constant Dk of the foam 62. For example, the dielectric constant Dk of the dielectric foam 62 can range from approximately 1.3 Dk to approximately 1.5 Dk. Thus, the dielectric constant Dk of the dielectric foam 62 can be less than or approximately equal to 1.5 Dk. In some examples, the dielectric constant can be approximately 1.5 Dk.

It is recognized that the delay of the electrical signals being transmitted along the electrical conductors 52 (also known as propagation delay) is proportional to the dielectric constant Dk of the inner electrical insulator 54. In particular, propagation delay (nanoseconds per foot) can equal 1.0167 times the square root of the dielectric constant Dk of the inner electrical insulator 54. Thus, the propagation delay can range from approximately 1.16 ns/ft to approximately 1.29 ns/ft. For instance, the propagation delay can range from approximately 1.16 ns/ft to approximately 1.245 ns/ft. In this regard, when the dielectric constant Dk of the dielectric foam 62 is approximately 1.3, the propagation delay can be approximately 1.16 ns/ft. When the dielectric constant Dk of the dielectric foam 62 is approximately 1.4, the propagation delay can be approximately 1.21 ns/ft. When the dielectric constant Dk of the dielectric foam 62 is approximately 1.5, the propagation delay can be approximately 1.245 ns/ft. When the dielectric constant Dk of the dielectric foam 62 is approximately 1.6, the propagation delay can be approximately 1.29 ns/ft.

As described above, the electrical cable 50 with the foamed inner electrical insulator 54 can have improved electrical performance with respect to the otherwise identical electrical cable 50' whose inner electrical insulator 54' is made of the solid electrically insulative material 60, as shown in FIG. 5. For instance, the electrical cable 50 with the foamed inner electrical insulator 54 can have reduced insertion losses with respect to the otherwise identical electrical cable 50' whose inner electrical insulator 54 is made of the solid electrically insulative material 60. The reduced insertion losses can allow the size of the electrical conductors 52 to be reduced with respect to the otherwise identical electrical cable 50. It is appreciated that when the size of the electrical conductors 52 is reduced, the size of the electrical cable 50 can be reduced. As one example, when the electrical conductors 52 are 34 gauge, 1024 electrical cables 50 conventionally fit through a 1 RU panel. When the electrical conductors 52 are higher than 34 gauge, more than 1024 electrical cables 50 can fit through a 1 RU panel.

In one example, the electrical cable 50 whose electrical conductors 52 have a first gauge size can be configured to transmit data signals along the electrical conductors 52 at a first frequency having a first level of insertion loss. The first level of insertion loss can be substantially equal to or less than a second level of insertion loss of the otherwise identical second electrical cable 50' conducting data signals along the electrical conductors 52' of a second gauge size at the same first frequency. Further, each of the cables 50 and 50' can have an impedance of approximately 100 ohms.

In one example, the first gauge size can be substantially equal to the second gauge size, and the first level of insertion loss can be less than the second level of insertion loss. In another example, the first gauge size can be greater than the second gauge size, and the first level of insertion loss can be substantially equal to the second level of insertion loss. In another example still, the first gauge size can be greater than the second gauge size, and the first level of insertion loss can less than the second level of insertion loss.

For instance, it has been found that when the first gauge size is approximately 34 awg, the electrical cable 50 can be configured to transmit electrical signals along the electrical conductors 52 at the first frequency of approximately 20 GHz with the first level of insertion loss no greater (that is, the negative number indicating a loss is no greater) than approximately −8 dB. When the electrical conductors 52' of the otherwise identical electrical cable 50' has the second gauge size equal to the first gauge size of approximately 34 awg, the otherwise identical electrical cable 50' transmits electrical signals along the electrical conductors 52' at the first frequency of approximately 20 GHz with the second level of insertion loss of approximately −9 dB.

For instance, it has been found that when the first gauge size is approximately 34 awg, the electrical cable can be configured to transmit electrical signals along the electrical conductors 52 at the first frequency of approximately 20 GHz with an insertion loss no greater (that is, the negative number indicating a loss is no greater) than approximately −7.7 dB. When the electrical conductors 52' of the otherwise identical electrical cable 50' has the second gauge size equal to the first gauge size of approximately 34 awg, the otherwise identical electrical cable 50' transmits electrical signals along the electrical conductors 52' at the first frequency of approximately 20 GHz with the second level of insertion loss of approximately −9 dB. Thus, the first level of insertion loss can be approximately 15% less than the second level of insertion loss.

In another example, when the electrical conductors 52 have a first gauge size of approximately 35 awg, and thus greater than the second gauge size, the electrical cable 50 can be configured to transmit electrical signals along the electrical conductors 52 at the first frequency of approximately 20 GHz with the first level of insertion loss no greater than approximately −8.6 dB. Accordingly, when the first gauge size is greater than the second gauge size at the same frequency and impedance, the insertion loss of the electrical cable 50 can be less than the insertion loss of the otherwise identical electrical cable 50'. For instance, the first level of insertion loss can be approximately 5% less than the second level of insertion loss. In this example, the first gauge size is greater than the second gauge size by approximately one awg.

In still another example, when the electrical conductors 52 have a first gauge size of approximately 36 awg, and thus greater than the second gauge size by approximately two gauge sizes awg, the electrical cable 50 can be configured to transmit electrical signals along the electrical conductors 52 at the first frequency of approximately 20 GHz with the first level of insertion loss no greater than the second level of insertion loss. Accordingly, when the first gauge size can be greater than the second gauge size at the same frequency and impedance, the insertion loss of the electrical cable 50 can be substantially equal than the second level of insertion loss of the otherwise identical electrical cable 50'. In this example, the first gauge size is greater than the second gauge size by more than approximately one awg, which can be referred to as a plurality of gauge sizes awg. Thus, the first gauge size can be a plurality of gauge sizes less than the second gauge size while maintaining substantially the same level of insertion loss at 20 GHz and at 100 ohms impedance.

Thus, the electrical conductors 52' of the otherwise identical second electrical cable 50' can have a second gauge size that is at least approximately one gauge size awg less than the first gauge size. For instance, the second gauge size can be a plurality of gauge sizes awg less than the first gauge size. Further, the inner electrical insulator of the otherwise identical second electrical cable 50' can include the electrically insulative material 60 that is unfoamed and solid. For instance, the inner electrical insulator 54' of the otherwise identical second electrical cable 50' can be made of only the solid unfoamed electrically conductive material 60. Thus, the electrical cable 50 can be sized smaller than the otherwise identical second electrical cable 50' while providing electrical performance that is no worse than the otherwise identical second electrical cable when both cables 50 conduct electrical signals the substantially same frequency within a range of frequencies at the substantially the same impedance.

When the first gauge size is greater than the second gauge size, it will be appreciated that one or both of the height and width of the electrical cable 50 can be less than that of the otherwise identical electrical cable 50'. Thus, when the first gauge size is greater than the second gauge size, it will be appreciated that one or both of the height and width of the electrical shield 56 can be less than that of the electrical shield 56' of the otherwise identical electrical cable 50'. Further, it is further appreciated as described above that when the first gauge size is less than the second gauge size, one of the height and the width of the electrical shield 56 of the electrical cable can be substantially equal to the width of the electrical shield 56' of the otherwise identical cable 50'. Thus, when the first gauge size is less than the second gauge size, one of the height and the width of the electrical cable 50 can be substantially equal to the width of the otherwise identical cable 50'. For instance, when the first gauge size is one gauge size awg less than the second gauge size, the width of the electrical shield 56 and thus the electrical cable 50 can be substantially equal to the width of the electrical shield 56' and thus the otherwise identical cable 50'.

In one example, when the first gauge size is 32 and the second gauge size is 33, the electrical cable 50 can define approximately the same width of the otherwise identical electrical cable 50'. Similarly when the first gauge size is approximately 33 awg and the second gauge size is approximately 34 awg, the electrical cable 50 and the otherwise identical electrical cable 50' can define approximately the same width. In this regard, it is recognized that when the first gauge size is approximately 33 awg, and the electrical cable 50 has approximately 100 ohm impedance, when the electrical cable 50 transmits signals at 20 GHz along the electrical conductors, the insertion loss can be approximately −6.9 dB. Thus, when the first gauge size is approximately 33 awg, and the electrical cable 50 has approximately 100 ohm impedance, when the electrical cable 50 transmits signals at 20 GHz along the electrical conductors, the insertion loss can be less than the insertion loss of the otherwise identical electrical cable 50' when transmitting signals at 20 GHz along the electrical conductors 52 at approximately 34 awg, and the otherwise identical electrical cable 50' has approximately 100 ohm impedance.

Similarly, when the first gauge size is 34 and the second gauge size is 35, the electrical cable 50 and the otherwise identical electrical cable 50' can define approximately the same width. Further, when the first gauge size is 35 and the second gauge size is 36, the electrical cable 50 and the otherwise identical electrical cable 50' can define approximately the same width.

Further still, when the first gauge size is approximately 32 awg and the second gauge size is approximately 33 awg, the electrical shield of the electrical cable 50 can define approximately the same width of the electrical shield 56' of the otherwise identical electrical cable 50'. Similarly when the first gauge size is approximately 33 awg and the second gauge size is approximately 34 awg, the electrical shield of the electrical cable 50 can define approximately the same width of the electrical shield 56' of the otherwise identical electrical cable 50'. Similarly, when the first gauge size is 34 and the second gauge size is 35, the electrical shield of the electrical cable 50 can define approximately the same width of the electrical shield 56' of the otherwise identical electrical cable 50'. Further, when the first gauge size is 35 and the second gauge size is 36, the electrical shield of the electrical cable 50 can define approximately the same width of the electrical shield 56' of the otherwise identical electrical cable 50'.

As other examples of improved electrical performance of the electrical cable 50, the electrical cable 50 can be configured to transmit electrical signals along the electrical conductors 52 at a frequency of approximately 8 GHz along an approximately five foot length of the electrical conductors 52. When the electrical conductors 52 have a gauge of 26 awg, the transmitted electrical signals can have an insertion loss that is between approximately 0 dB and approximately −3 dB. Further, the electrical conductors 52 can be solid and unstranded.

In another example, when the electrical conductors 52 have a gauge of approximately 36 awg and the and a length of approximately five feet, the electrical cable 50 can be configured to transmit electrical signals along the electrical conductors at a frequency up to approximately 50 GHz with an insertion loss between approximately 0 dB to approximately −25 dB. The electrical conductors 52 can be solid and unstranded.

In a further example, when the electrical conductors 52 have a gauge of approximately 35 awg and a length of approximately 0.45 meter, the electrical cable is configured configured to transmit electrical signals along the electrical conductors 52 at approximately 112 gigabits per second with an insertion loss no worse than −5 decibels at approximately 28 GHz or less.

In yet another example, when the electrical conductors 52 have a gauge of approximately 33 awg and a length of approximately 0.6 meter, the electrical cable 50 is configured to transmit electrical signals along the electrical conductors 52 at approximately 112 gigabits per second with an insertion loss no worse than −5 decibels at approximately 28 GHz or less.

Further, electrical signals travelling along the electrical conductors 52 at frequencies up to approximately 50 GHz can operate without any insertion losses that vary more than 1 dB within a frequency delta of 0.5 GHz. That is, in this example, at any frequency up to 50 GHz, the frequencies of the electrical signals that vary less than 0.5 GHz from each other will not have respective insertion losses that differ by more than 1 dB.

The electrical cable 50 can further operate with reduced skew. Skew can occur when the electrical signals traveling from along a length of the electrical conductors 52 of the cable 50 can reach the end of the length at different times. The skew of electrical signals traveling along the electrical cable 50 has been tested per one meter of length of the electrical conductors 52. For instance, the method of testing included cutting the electrical cable 50 to a specified length, and precision cutting one end of the cable to define a blunt and square end. The cable 50 was then placed into a fixture apparatus that retained the cable 50 in a substantially straight orientation. Next, the cut end of the cable was put into tooling and connected to a printed circuit board to which a solderless test fixture was mounted. The test instrumentation was then calibrated, and signals were applied to the electrical conductors 52 at a specified frequency, and skew was measured.

It was found in one example that the electrical conductors 52 of the electrical cable 50 can conduct electrical signals at 14 Gigabits per second while compliant with NRZ line code with no more than approximately 14 picoseconds per meter of skew. For instance, the electrical conductors 52 can conduct electrical signals at 28 Gigabits per second while compliant with NRZ line code with no more than approximately 7 picoseconds per meter of skew. In particular, the electrical conductors 52 can conduct electrical signals at 56 Gigabits per second while compliant with NRZ line code with no more than approximately 3.5 picoseconds per meter of skew. In one particular example, the electrical conductors 52 can conduct electrical signals at 128 Gigabits per second while compliant with NRZ line code with no more than approximately 1.75 picoseconds per meter of skew.

Referring now to FIGS. 6A-6D, a system 70 and method can be provided for fabricating the electrical cable 50 as described herein. The system 70 can include a payoff station 72 that is configured to support a length of electrical conductors 52. The system can further include a tensioner 74 that receives the electrical conductors 52 from the payoff station 72, and applies tension to the electrical conductors 52 as they translate in a forward direction to a cable accumulator station 75. The electrical conductors 52 can be maintained in tension from the tensioner 74 to the accumulator station 75. The electrical conductors 52 can translate at any suitable speed as desired. In one example, the electrical conductors 52 can translate at a line speed that ranges from approximately 30 feet per minute to approximately 40 feet per minute. The tension applied to the electrical conductors 52 can maintain the electrical conductors in a predetermined spatial relationship relative to each other. For instance, the electrical conductors 52 can be maintained substantially parallel to each other as they extend in the forward direction.

The system 70 can further include a hopper 76 that receives pellets of the electrically insulative material, and an extruder 78 that is configured to receive the pellets from the hopper 76. The electrically insulative material can include a suitable nucleating agent. The extruder 78 is configured to produce molten electrically insulative material from the pellets. The system can further include a gas injector that is coupled to the extruder 78 and configured to introduce the foaming agent into the molten electrically insulative material 60 to produce gas-infused molten electrically insulative material 60. In particular, the foaming agent can be dissolved into the molten electrically conductive material. In one example, the foaming agent can be introduced into the molten electrically insulative material at a pressure that is from approximately 1 to approximately 3 times that of the molten electrically insulative material. For instance, the pressure is from approximately 1.5 to approximately 2 times that of the molten electrically insulative material. In particular, the pressure can be approximately 1.8 times that of the molten electrically insulative material.

The system 70 can further include a cross-head 80 that is configured to receive the gas-infused molten electrically insulative material 60. Thus, the step of surrounding and coating the electrical cables with the molten electrically insulative material 60 can be performed after the step of introducing the foaming agent into the molten electrically insulative material. In some examples, it is envisioned that the foaming agent can be introduced into the molten electrically conductive material 60 in the cross head 80. The electrical conductors 52 can travel from the tensioner through the cross-head, which causes the electrical conductors 52 to be coated with the molten electrically conductive material. The molten electrically conductive material further adheres to the electrical conductors. As the electrical conductors 52 exit the cross-head 80, the pores can be generated in the electrically insulative material 60, so as to produce the foam.

The cross-head 80 can include a die 82 that has an inner surface 84 that, in turn, defines an internal void 86. The cross-head 80 can further include a tip 88 that is supported at least partially or entirely in the internal void 84. The electrical cables 52 can be directed through a conduit 87 that extends forward into the head 80, and subsequently through the tip 88 that is aligned with the conduit 87. The cross-head 80 can define a channel 90 that extends from the inner surface 84 of the die 82 and the tip 88. In one example, the channel 90 can surround an entirety of the tip 88 in a plane that is oriented perpendicular to the forward direction. The tip 88 can define an inlet 92 that receives the electrical cables 52. The inlet 92 can be spaced from the die 82 in a rearward direction that is opposite the forward direction. The tip 88 can define an outlet 94 that is opposite the inlet 92 in the forward direction, and is disposed in the die 82. The electrical cables 52 can thus be translated through the tip 88 from the inlet 92 to the outlet 94. The gas-infused molten electrically insulative material can be directed from an injector 95 into a conduit 97 that is in fluid communication with an inlet 96 of the die 82. Thus, the gas-infused molten electrically insulative material can travel from the conduit 96 and into the channel 90 through the inlet 96 at a location upstream of the outlet 94 of the tip 88. The gas-infused molten electrically insulative material can be at a temperature that ranges from approximately 200 F to approximately 775 F. For instance, the electrically conductive material 60 can be maintained at a barrel temperature that ranges from approximately 300 F to approximately 775 F in the barrel of the extruder 78. In one example, the barrel temperature can range from approximately 625 to approximately 700 F. In the head of the extruder 78 downstream of the barrel, the electrically conductive material can be maintained at a head temperature that ranges from approximately 350 F to approximately 775 F. For instance, the head temperature can range from approximately 690 F to approximately 730 F. The electrically conductive material can be maintained at a throat temperature in the throat of the extruder 78 that can range from approximately 100 F to approximately 200 F. For instance, the throat temperature can be approximately 200 F, below the boiling point of water.

The gas-infused molten electrically insulative material can travel through the channel 90 from the inlet 96 to an outlet 98 of the die 82. The outlet 98 of the die 82 can also define an outlet of the cross-head 80. The channel 90 can have any suitable size and shape as desired. In one example, the channel 90 can define a cross-sectional area in a plane that is oriented perpendicular to the forward direction. The cross-sectional area of the channel 90 can decrease in a direction from the inlet 96 toward the outlet 98 of the die 82. In one example, the cross-sectional area of the channel 90 can decrease from the inlet 96 to the outlet 98 of the die 82. Thus, the gas-infused molten electrically insulative material can be at a pressure that increases as the gas-infused molten electrically insulative material travels through the channel 90 in the forward direction. For instance, the pressure of the gas-infused molten electrically insulative material in the channel 90 can be such that the electrically insulative material in the barrel of the extruder 78 is maintained at a barrel pressure that ranges from approximately 400 pounds per square inch (PSI) to approximately 2000 PSI. For example, the barrel pressure can range from approximately 600 PSI to approximately 1500 PSI. In some examples, the temperature of the electrically insulative material in the channel 90 can be maintained at a cooler temperature than the head temperature. For instance, the cooler temperature can range from approximately 2% to approximately 10% less than the head temperature. In one example, the cooler temperature can range from approximately 2% to approximately 5% less than the head temperature.

The outlet 98 of the die 82 can be aligned with the outlet 94 of the tip 88 in the forward direction. For instance, the outlet 98 of the die 82 can be colinear with the outlet 94 of the tip 88. The outlet 94 of the tip 88 can be spaced from the outlet 98 of the die 82 in the rearward direction. Thus, the gas-infused molten electrically insulative material can travel through the channel to a location between the outlet 94 of the tip 88 and the outlet 98 of the die 82. Accordingly, the gas-infused molten electrically insulative material can coat the electrical conductors 52 in the die 82 at a location downstream of the outlet 94 of the tip 88. In particular, the electrical conductors 52 can be coated by the gas-infused molten electrically insulative material as the at least one electrical conductors 52 exit the outlet 94 of the tip 88 and travels into the die 82. Thus, it should be appreciated that the electrically conductive material can be co-extruded with the electrical conductors 52. The term "downstream" can be used herein to reference the forward direction. Conversely, the term "upstream" and derivatives thereof can be used herein to reference the rearward direction.

It should be appreciated that the die 82 and the tip 88 define a gap 100 therebetween in the forward direction. The gap 100 can be at least partially or entirely defined by the channel 90. Further, the gap 100 can be an adjustable gap. In particular, the tip 88 can be selectively movable in the forward and rearward directions so as to adjust the size of the gap. Otherwise stated, the tip 88 can be selectively moved toward and away from the outlet 98 of the die 82. Moving the tip 88 in the forward direction toward the outlet 98 of the die 82 can reduce the size of the gap 100. Conversely, moving the tip 88 in the rearward direction away from the outlet 98 of the die 82 can increase the size of the gap 100. It has been found that the size of the gap 100 can affect the average size of the pores. Thus, the method can include the step of controlling the gap 100 so as to correspondingly control an average size of the pores. In particular, reducing the size of the gap can increase the pressure of the gas-infused molten electrically insulative material in the channel 90 which, in turn can increase the average size of the pores. In one example, it can be desirable to maintain the gap 100 in a range from a minimum size to a maximum size. The minimum size can be approximately 0.025 inch, and the maximum size can be approximately 0.05 inch in certain examples. Thus, the gap 100 can be approximately 0.05 inch when the tip 88 is in a fully rearward position. The gap 100 can be approximately 0.025 inch when the tip 88 is in a fully forward position. When the tip 88 is in the fully forward position and it is desirable to further increase the pressure of the gas-infused electrically insulative material, the line speed of the electrical conductors 52, and thus the flow rate of the molten electrically insulative material can be increased. Conversely, when the tip 88 is in the fully rearward position and it is desirable to further decrease the pressure of the gas-infused electrically insulative material, the line speed of the electrical conductors 52 can be decreased. It has been found that as the pressure of the molten electrically insulative material increases, the average void volume of the pores 64 can decrease.

When the electrical conductors 52 are coated with the gas-infused molten electrically insulative material, and travel out of the outlet 98 of the die 82, the ambient temperature can cool the gas-infused molten electrically insulative material, and the pressure of the gas-infused molten electrically insulative material can be rapidly reduced. It is recognize that the size and shape of the outlet 98 of the die 82 can at least partially determine the size and shape of the inner electrical insulator 54. Further, it can be desirable to prevent the molten electrically insulative material from adhering to either or both of the die 82 and the tip 88. In one example, the die 82 and the tip 88 can be made from an austenitic nickel-chromium-based superalloy. For instance, the austenitic nickel-chromium-based superalloy can be provided as Inconel. It should be appreciated, of course, that the die 82 and the tip 88 can be made of any suitable alternative material. As the gas-infused molten electrically insulative material and the supported electrical conductors 52 exit through the outlet 98 of the die 82, the gas in the electrically insulative material can rapidly expand, thereby forming the pores, and transforming the electrically insulative material into a foam. Further, the reduction in temperature can cause the electrically insulative material to solidify.

It is recognized that as the electrically insulative material transforms into the foam, the electrically conductive material can expand due to the formation of the pores. Thus, as the electrically conductive material expands, the distance that separates the electrical conductors 52 that are supported by the electrically conductive material also increases to a final distance that is substantially equal to the separation distance 53 (see FIG. 4). The foam can be solidified while the electrical conductors 52 are separated from each other by the final distance. Accordingly, it can be desirable to maintain the electrical conductors 52 separated from each other at an initial separation distance prior to coating the electrical conductors 52 with the gas-infused molten electrically conductive material. In one example, the initial separation distance can range from approximately 5% to approximately 20% less than the final distance, and thus less than the separation distance 53. In particular the initial separation distance can range from approximately 10% to approximately 12% of the final distance, and thus less than the separation distance 53. The electrical conductors 52 can be separated from each other by the initial separation distance as they enter the cross-head 80, and in particular as they enter the tip 88. For instance, the electrical conductors 52 can be separated from each other by the initial separation distance as they exit the enter the cross-head 80, and in particular as they exit the tensioner 74.

The system 70 can further include a liquid bath 102 that is disposed downstream of the cross-head 80, and thus downstream of the outlet 98 of the die 82. The liquid bath can be maintained at room temperature, or any suitable alternative temperature as desired. The foam and supported electrical conductors 52 can translate through the liquid bath 102 so as to further cool and solidify the foam. The electrical shield 56 can be applied to the inner electrical insulator, and the outer electrical insulator 58 can be applied to the electrical shield in the usual manner.

Figure 7A:
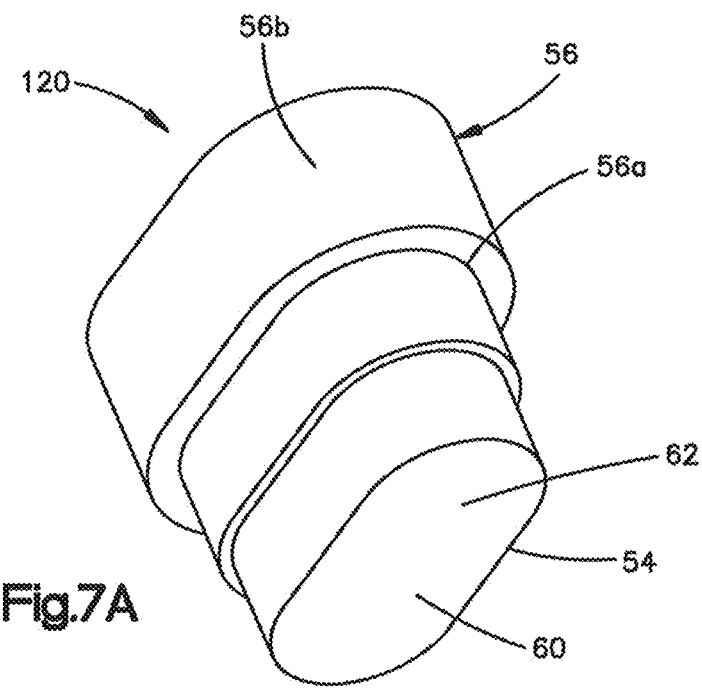
FIG. 7A is a perspective view of a waveguide including the electrical insulator illustrated in FIG. 2.
Figure 7B:
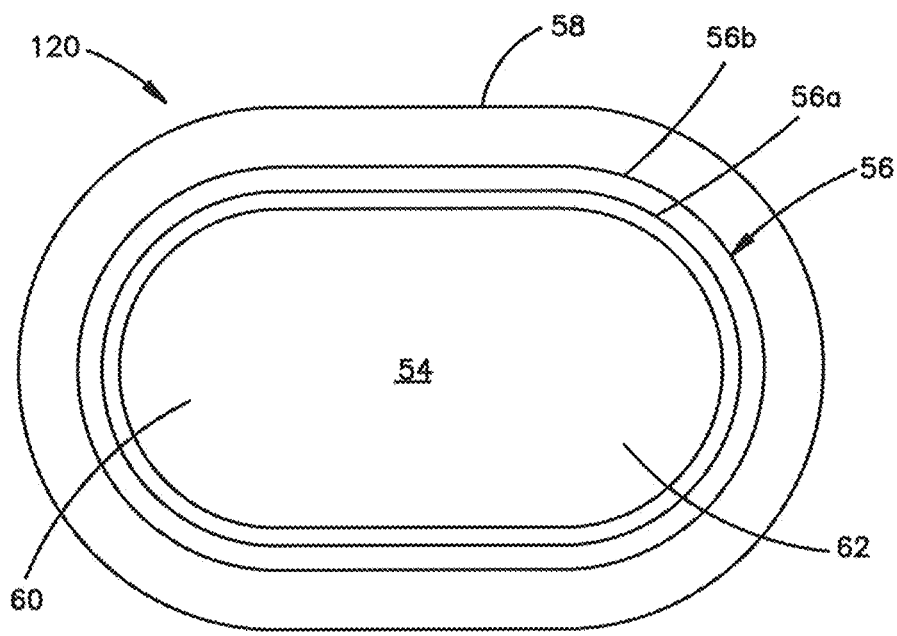
FIG. 7B is an end elevation view of the waveguide illustrated in FIG. 7A, but including an electrically insulative jacket in another example.

Referring now to FIGS. 7A-7B, while the dielectric foam 62 can define the inner electrical insulator 54 of the electrical twinaxial cable 50 in the manner described above, it is recognized that the dielectric foam 62 described above can at least partially define a waveguide 120 that is configured to propagate radio frequency (RF) electrical signals from a first electrical component to a second electrical component. For instance, the dielectric foam 62 can define an inner electrically insulator 54 of the waveguide 120. In one example, the waveguide 120 can be devoid of electrically conductive material 60 that is disposed within an outer perimeter of the inner electrical insulator 54 in a plane that is oriented in cross-section with respect to the central axis of elongation of the waveguide 120.

The waveguide 120 can further include a shield 56 constructed in accordance with any manner described above with the shield 56 of the electrical cable 50. Thus, the shield 56 can be configured as an electrically conductive shield that provides total internal reflection. The shield 56 can surround and abut outer perimeter of the dielectric foam 62 along a majority of the length of the foam 62. For instance, the shield 56 can include the first layer 56a that surrounds and abuts the inner electrical insulator. The shield 56 can include the second layer 56b that surrounds the first layer 56a. Alternatively, the shield 56 can include only the first layer 56a. The first layer 56a can be configured as an electrically conductive coating applied to the outer perimeter of the inner electrical insulator 54. The coating can be configured as a silver, gold, copper, or an alloy thereof. Alternatively, the first layer 56a can be a foil or tape of the type described herein, or any suitable alternative material. The second layer 56b can similarly be a foil or tape of the type described herein, or any suitable alternative material. As illustrated in FIG. 7A, the outer perimeter of the electrical shield 56 can define the outer perimeter of the waveguide 120. Alternatively, as illustrated in FIG. 7B, the waveguide 120 can include the outer electrical insulator 58 that surrounds the electrical shield 56 as described above with respect to the electrical cable 50.

The electrically insulative material 60 can be extruded through any suitable die in the manner described above, but without being coated onto any other structures as it travels through the die 78 (see FIG. 6B). Further, the cross-head 80 can be devoid of the tip 88. Further still, the outlet 98 of the die 78 can define any suitable cross-section as desired, such as a cylinder. Thus, as the molten electrically insulative material travels through the outlet 98, the molten electrically insulative material will define a cylindrical shape when it undergoes rapid expansion to produce the dielectric foam.

In one example, the dielectric foam 62 can be the only material inside the electrical shield 56 other than gas. Alternatively, the inner electrical insulator 54 can further include one or more dielectric fibers that extend through the dielectric foam 62. For instance, the one or more dielectric fibers can extend parallel to the central axis of the inner electrical insulator 54. The molten electrically insulative material can be co-extruded with one or more dielectric fibers in the manner described above with respect to the electrical conductors 52. Thus, the molten electrically insulative material can coat and adhere to the one or more dielectric fibers that travel through the tip 88. The dielectric fibers can assist in the extrusion process, as the fibers provide a substrate for the molten electrically insulative material to adhere to during the extrusion process. The one or more fibers can be radially centrally disposed in the electrically conductive material as desired. Further, the one or more fibers can be electrically insulative. For instance, the one or more fibers can be configured as a filament, tape, combination thereof, or any suitable alternative structure that can be fed through the cross-head, such that the molten electrically insulative material coats and adheres to the one or more fibers. In one example, the one or more fibers can have a low dielectric constant Dk that is equal to or less than the dielectric constant of the electrically insulative material 60. In one example, the one or more fibers can be expanded polytetrafluoroethylene (EPTFE).

During operation, electrical radio frequency (RF) signals can thus propagate along the length of the waveguide 120, inside the electrical shield 56. It should be appreciated that the waveguide 124 can be devoid of electrical conductors disposed inside the electrical shield 56. Otherwise stated, in some examples, the only electrically conductive material that extends along at least a majority of the length of the inner electrical insulator 54 of the waveguide 120 can be the electrical shield 56.

It should be understood that the foregoing description is only illustrative of the present invention. Various alternatives and modifications can be devised by those skilled in the art without departing from the present invention. Accordingly, the present invention is intended to embrace all such alternatives, modifications, and variances that fall within the scope of the appended claims.

What is claimed is:
1. An electrical cable comprising:
  a monolithic inner electrical insulator that comprises an electrically insulative material that is foamed so as to define a plurality of pores in the electrically insulative material;
  a pair of electrical conductors each surrounded by the inner electrical insulator along at least a majority of their respective lengths, wherein the electrical conductors are oriented substantially parallel to each other and spaced apart from each other;
  an electrically conductive shield that is disposed about at least a majority of a respective overall length of the inner electrical insulator; and
  an outer electrical insulator that surrounds at least a majority of a respective overall length of the electrically conductive shield,
  wherein the electrical cable includes only a single electrically insulative material disposed inside the electrical shield, and
  wherein the inner electrical insulator defines a radially outer perimeter that is substantially continuous and uninterrupted by open pores, wherein the radially outer perimeter is oval or racetrack shaped.

2. The electrical cable as recited in claim 1, wherein at least approximately 80% of the pores are fully enclosed by the electrical insulator.

3. The electrical cable as recited in claim 2, wherein approximately 90% of the pores are fully enclosed by the electrically insulative material.

4. The electrical cable as recited in claim 3, wherein approximately 95% of the pores are fully enclosed by the electrically insulative material.

5. The electrical cable of claim 1, wherein the electrical conductors have no more than approximately 14 picoseconds per meter of skew.

6. The electrical cable of claim 1, wherein the electrical conductors have no more than approximately 14 picoseconds per meter of skew when conducting electrical signals at 14 Gigabits per second NRZ.

7. The electrical cable of claim 1, wherein the electrical conductors have no more than approximately 7 picoseconds per meter of skew.

8. The electrical cable of claim 1, wherein the electrical conductors have no more than 7 picoseconds per meter of skew when conducting electrical signals at 28 Gigabits per second NRZ.

9. The electrical cable of claim 1, wherein the electrical conductors have no more than approximately 3.5 picoseconds per meter of skew.

10. The electrical cable of claim 1, wherein the electrical conductors have no more than approximately 3.5 picoseconds per meter of skew when conducting electrical signals at 56 Gigabits per second NRZ.

11. The electrical cable of claim 1, wherein the electrical conductors have no more than approximately 1.75 picoseconds per meter of skew.

12. The electrical cable of claim 1, wherein the electrical conductors have no more than approximately 1.75 picoseconds per meter of skew when conducting electrical signals at 128 Gigabits per second NRZ.

13. The electrical cable of claim 1, wherein the electrical conductors comprise at least one of copper, copper-nickel, silver, aluminum, tin, and one or more alloys thereof.

14. The electrical cable of claim 1, wherein the electrical conductors have a gauge in a range from approximately 25 awg to approximately 36 awg.

15. The electrical cable of claim 1, wherein the pores have an average void volume that is less than 50% of a wall thickness of the foam.

16. The electrical cable of claim 1, wherein the electrical cable is configured to transmit electrical signals along the electrical conductors at a frequency of approximately 8 GHz along an approximately five foot length of the electrical cable, wherein the electrical conductors have a gauge of approximately 26 awg, and the transmitted electrical signals have an insertion loss between approximately 0 dB to approximately-3 dB.

17. The electrical cable of claim 1, wherein when the electrical conductors have a gauge of approximately 36 awg, a length of approximately five feet, the electrical conductors are configured to transmit electrical signals at a frequency up to approximately 50 GHz with an insertion loss in a range from approximately 0 dB to approximately-25 dB.

18. The electrical cable of claim 1, wherein respective centers of the electrical conductors are spaced from each other a distance that is in a range from approximately 0.005 inch to approximately 0.025 inch.

19. The electrical cable of claim 1, wherein the electrical conductors are configured to transmit electrical signals having a propagation delay less than approximately 1.245 nanoseconds per foot.

20. The electrical cable of claim 19, wherein the propagation delay ranges from approximately 1.16 nanoseconds per foot to approximately 1.245 nanoseconds per foot.

21. The electrical cable of claim 1, wherein electrical signals travelling along the electrical conductors at frequencies up to approximately 50 GHz do not have insertion losses that vary more than 0.5 dB within a frequency delta of 0.5 GHz.

22. The electrical cable of claim 1, wherein when the electrical conductors have a gauge of approximately 35 awg, the electrical cables are configured to transmit electrical signals at approximately 112 gigabits per second along a length of approximately 0.45 meter with an insertion loss no worse than-5 decibels at 28 GHz or less.

23. The electrical cable of claim 1, wherein when the electrical conductors have a gauge of approximately 33 awg, the electrical cables are configured to transmit electrical signals at approximately 112 gigabits per second along a length of approximately 0.6 meter with an insertion loss no worse than-5 decibels at 28 GHz or less.

24. The electrical cable of claim 1, wherein an entirety of the radially outer perimeter is continuous and uninterrupted by open pores.

25. The electrical cable of claim 1, wherein the pores are substantially uniform in the inner electrical insulator.

26. The electrical cable of claim 1, wherein the inner electrical insulator defines a radially inner perimeter opposite the radially outer perimeter, and the radially inner perimeter is substantially continuous and uninterrupted by open pores.

* * * * *